(12) United States Patent
Wada et al.

(10) Patent No.: US 6,413,149 B1
(45) Date of Patent: Jul. 2, 2002

(54) ABRADING PLATE AND POLISHING METHOD USING THE SAME

(75) Inventors: Yutaka Wada, Chigasaki; Hirokuni Hiyama, Tokyo; Kazuto Hirokawa, Chigasaki; Hisanori Matsuo, Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/446,764
(22) PCT Filed: Apr. 28, 1999
(86) PCT No.: PCT/JP99/02270
§ 371 (c)(1), (2), (4) Date: Dec. 23, 1999
(87) PCT Pub. No.: WO99/55493
PCT Pub. Date: Nov. 4, 1999

(30) Foreign Application Priority Data

Apr. 28, 1998 (JP) .......................................... 10-134432
May 14, 1998 (JP) .......................................... 10-150546

(51) Int. Cl.$^7$ ................................................ B24B 1/00
(52) U.S. Cl. .......................... 451/41; 415/285; 415/59; 415/548
(58) Field of Search .................... 451/41, 285, 587, 451/59, 63, 533, 548, 526, 540; 51/295, 293, 298

(56) References Cited

U.S. PATENT DOCUMENTS 4,010,583 A * 3/1977 Highberg ..................... 451/548
5,135,892 A * 8/1992 Ellison-Hayashi et al. ..... 501/1

(List continued on next page.)

FOREIGN PATENT DOCUMENTS

JP 56-52183 5/1981
JP 4-354676 12/1992

(List continued on next page.)

*Primary Examiner*—Joseph J. Hail, III
*Assistant Examiner*—Hadi Shakeri
(74) *Attorney, Agent, or Firm*—Wenderoth, Lind & Ponack, L.L.P.

(57) ABSTRACT

The present invention provides an abrading plate having self-stopping capability such that when an object, such as a semiconductor wafer having a device structure that includes raised regions and depressed regions fabricated on the surface, is being polished, the raised regions are removed and polishing stops automatically. A method of using the abrading plate is also provided.

The present invention relates to an abrading plate that produces a flat and mirror polished surface on an object with an abrading plate comprised by abrasive particles having a chemical purity of not less than 90% and a particle size of not more than two micrometers; a binder material; and a given volume of porosity, wherein a ratio of the abrasive particles and the binder material is not less than 1:0.5 by volume, and proportions of abrasive particles, a binder material and porosity are, respectively, not less than 10%, not more than 60% and 10–40 by volume.

The method is provided for polishing an object having a device structure that includes raised regions and depressed regions fabricated on the surface according to the steps of polishing the surface for a given duration with a liquid not containing abrasive particles so as to eliminate the raised regions to obtain a flat surface, and performing additional surface removal by supplying abrasive particles to the polishing interface to remove surface material uniformly from the entire surface.

22 Claims, 24 Drawing Sheets

U.S. PATENT DOCUMENTS

| | | | | |
|---|---|---|---|---|
| 5,307,593 A | * | 5/1994 | Lucker et al. | 451/539 |
| 5,658,194 A | * | 8/1997 | Micheletti | 451/540 |
| 5,690,705 A | * | 11/1997 | Holmes et al. | 51/298 |
| 5,885,134 A | * | 3/1999 | Shibata et al. | 451/41 |
| 5,976,204 A | * | 11/1999 | Hammarstrom et al. | 51/298 |
| 5,993,298 A | * | 11/1999 | Duescher | 451/56 |
| 6,099,393 A | * | 8/2000 | Katagiri et al. | 451/56 |
| 6,099,394 A | * | 8/2000 | James et al. | 451/527 |
| 6,121,143 A | * | 9/2000 | Messner et al. | 451/530 |
| 6,123,603 A | * | 9/2000 | Tada et al. | 451/41 |
| 6,220,944 B1 | * | 4/2001 | Chen | 451/285 |

FOREIGN PATENT DOCUMENTS

| | | |
|---|---|---|
| JP | 5-4171 | 1/1993 |
| JP | 9-47969 | 2/1997 |
| JP | 9-174428 | 7/1997 |
| JP | 9-232257 | 9/1997 |
| JP | 10-134316 | 5/1998 |
| JP | 10-329031 | 12/1998 |
| JP | 11-198045 | 7/1999 |

* cited by examiner

FIG. 2
(PRIOR ART)
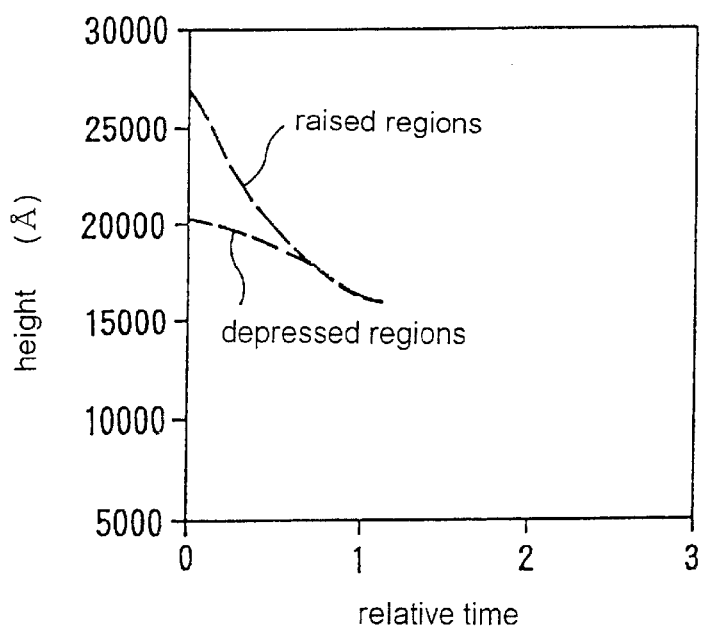
FIG. 3A
(PRIOR ART)
FIG. 3B
(PRIOR ART)
FIG. 3C
(PRIOR ART)
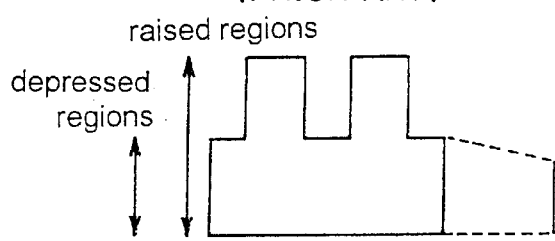
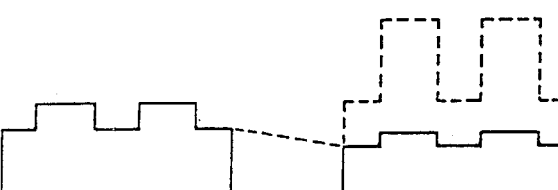

*F I G. 12*
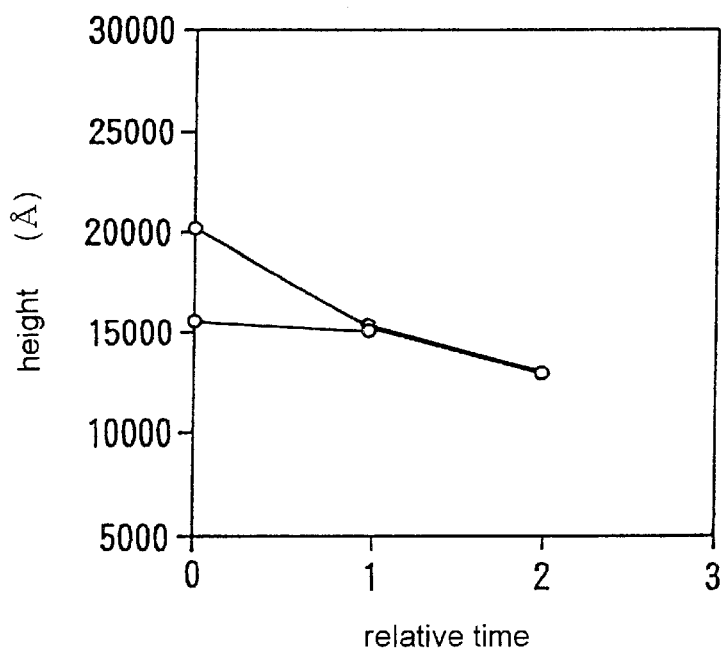
*F I G. 13A   F I G. 13B   F I G. 13C*
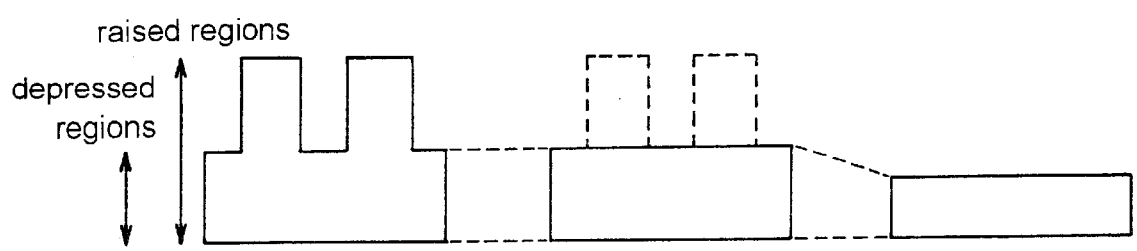

FIG. 15A
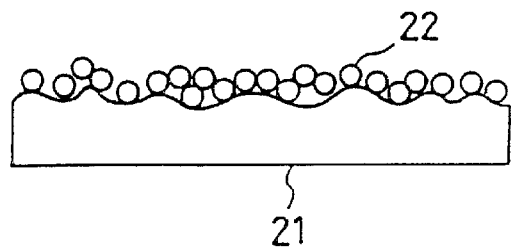
FIG. 15B
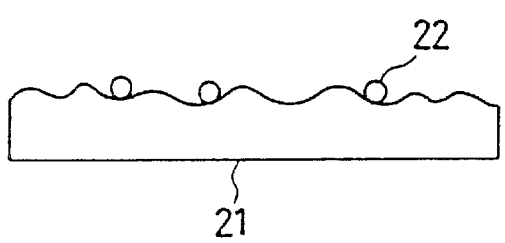
FIG. 16A
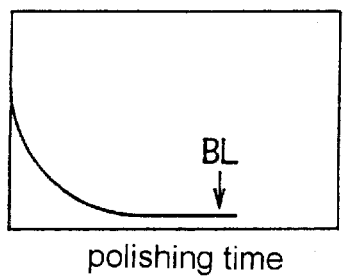
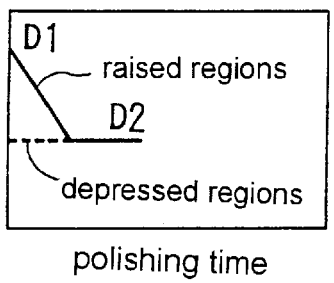
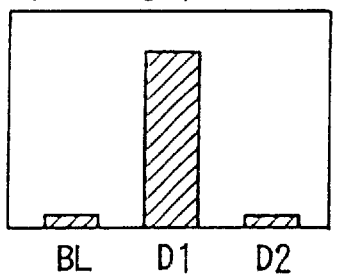
FIG. 16B
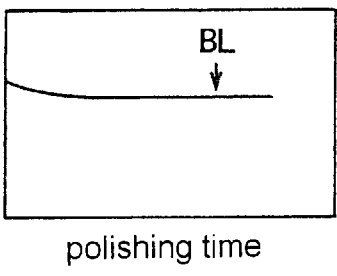
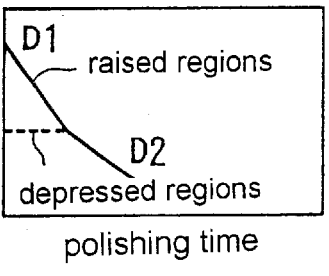
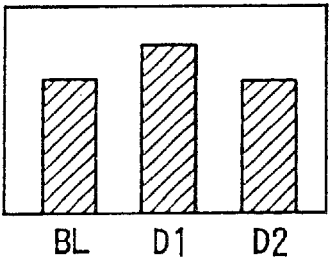
FIG. 16C
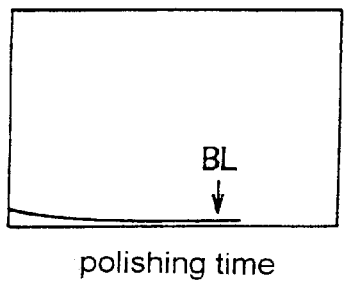
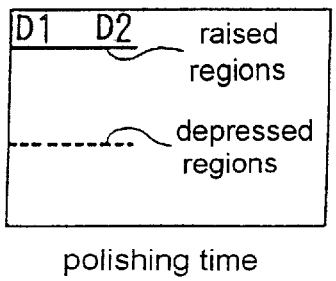
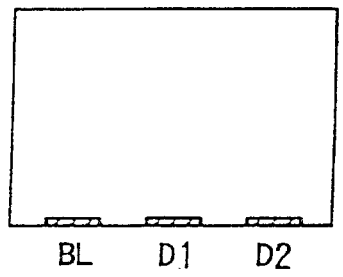

the first stage (planarization)
FIG. 19
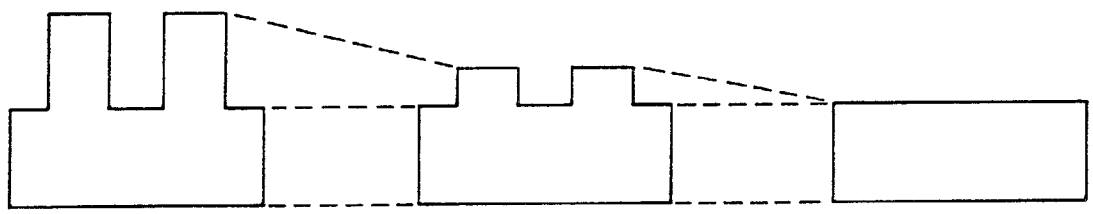
the second stage
(surface material removal)
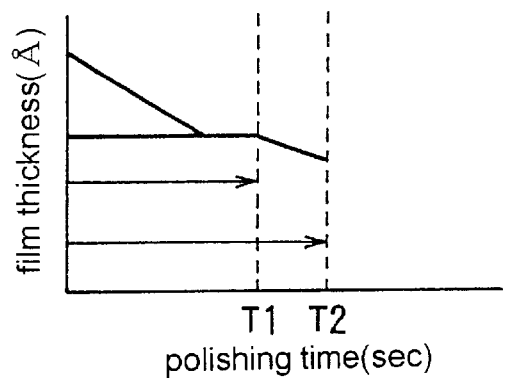
FIG. 20A
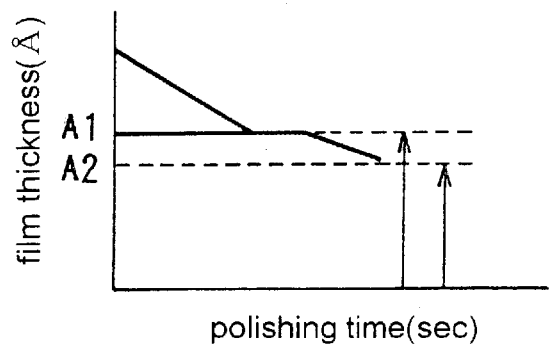
FIG. 20B

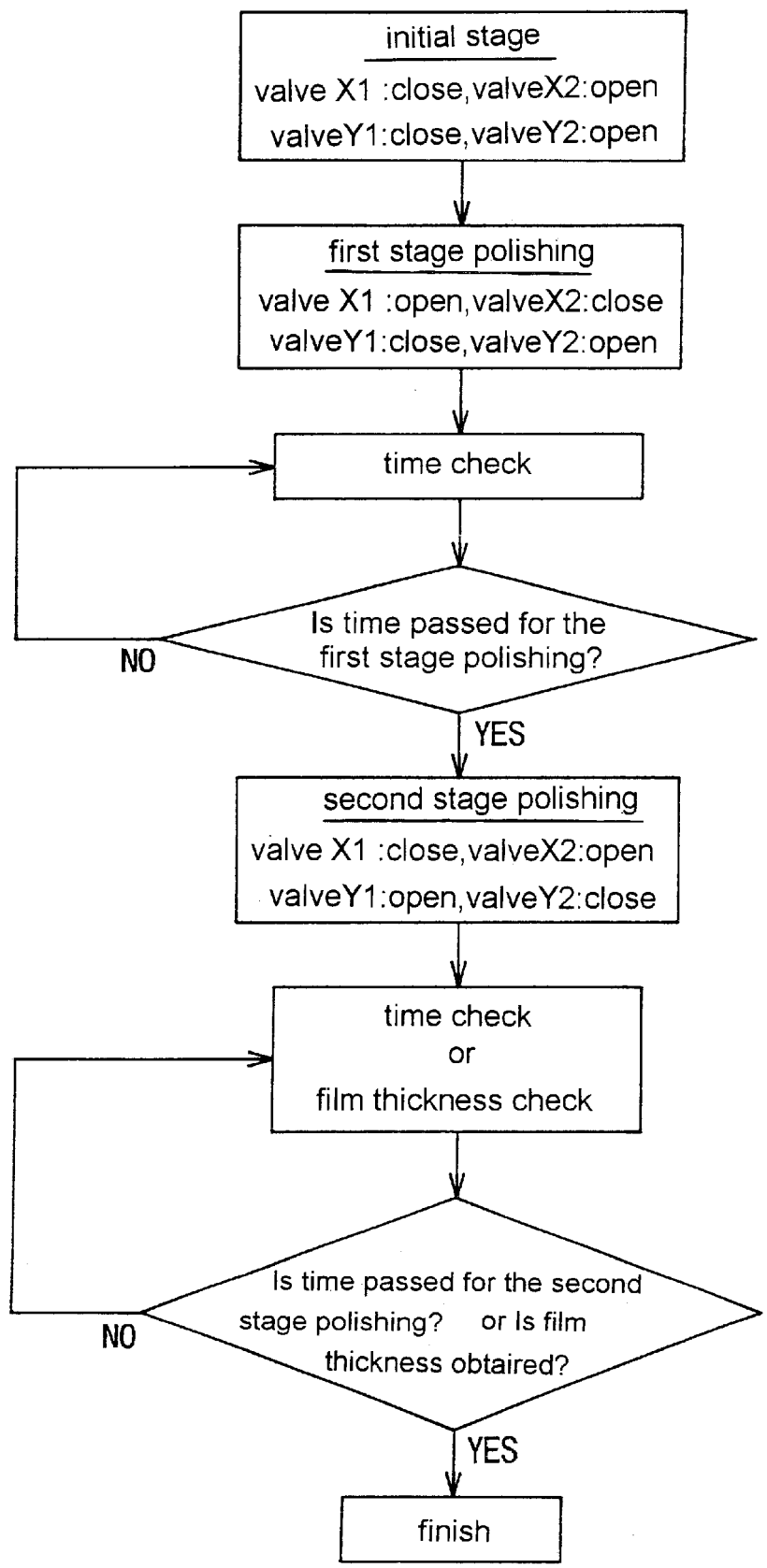

F I G. 25
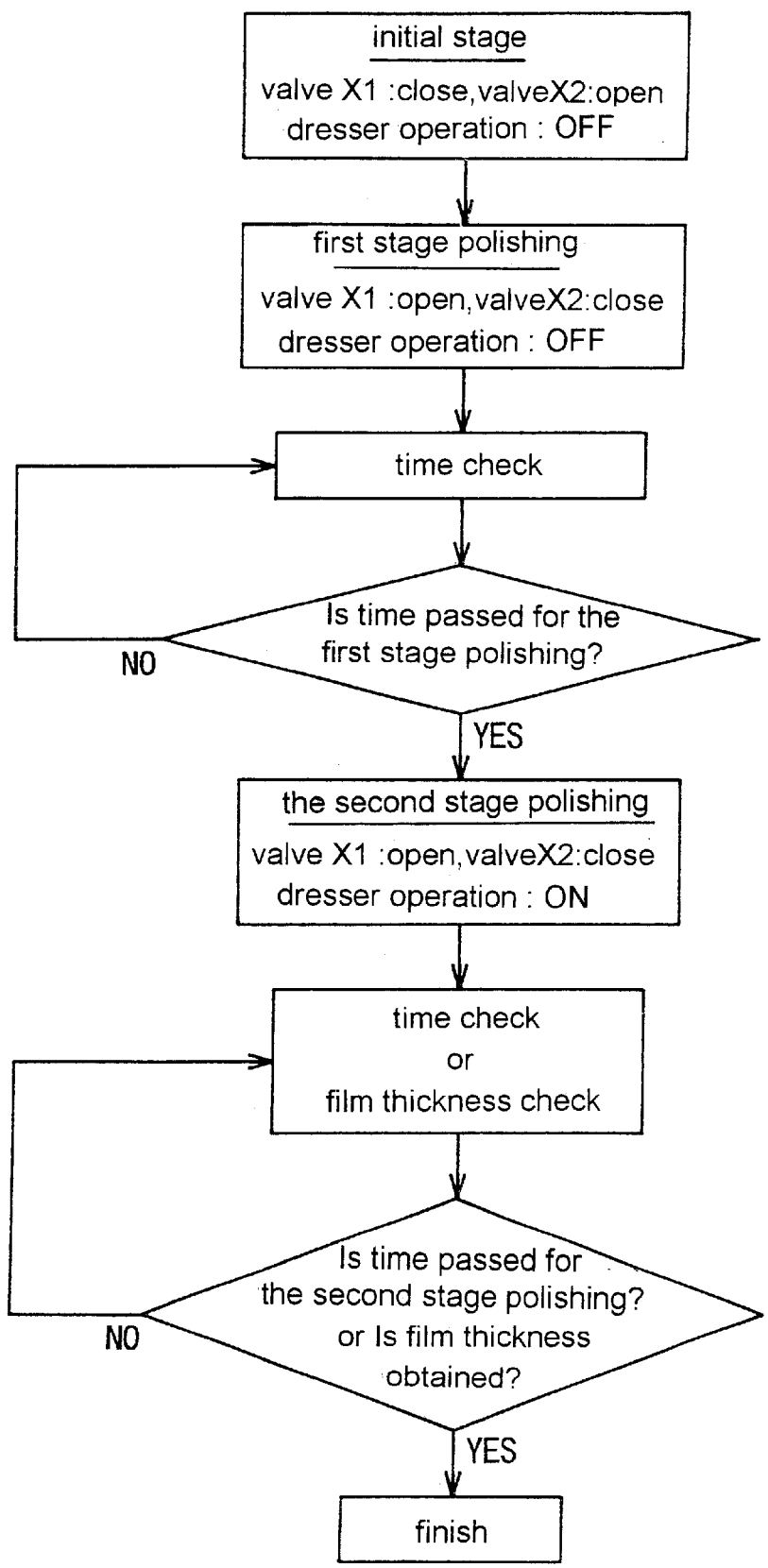

FIG. 26A
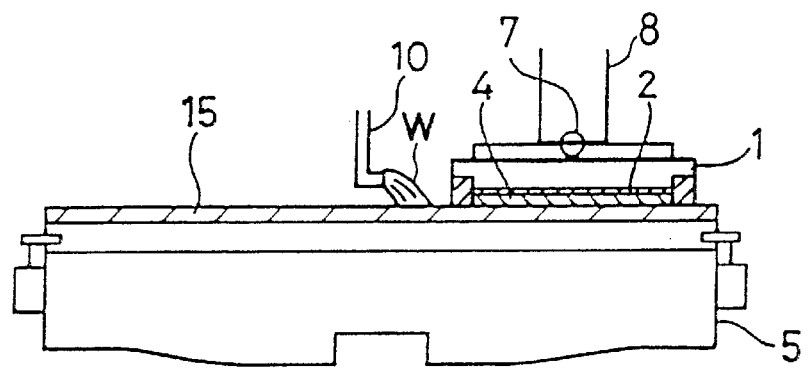
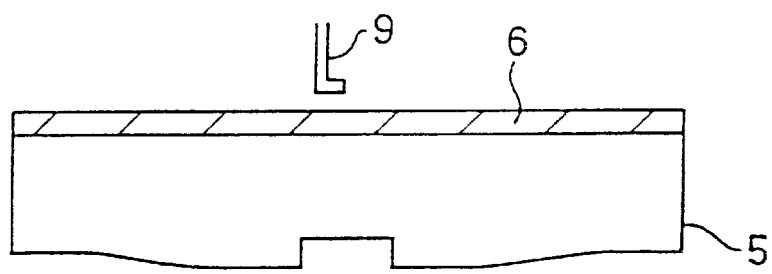
FIG. 26B
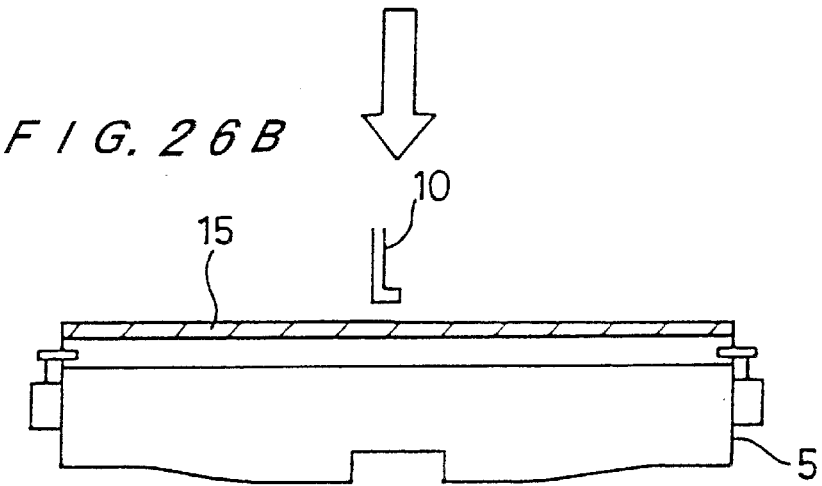
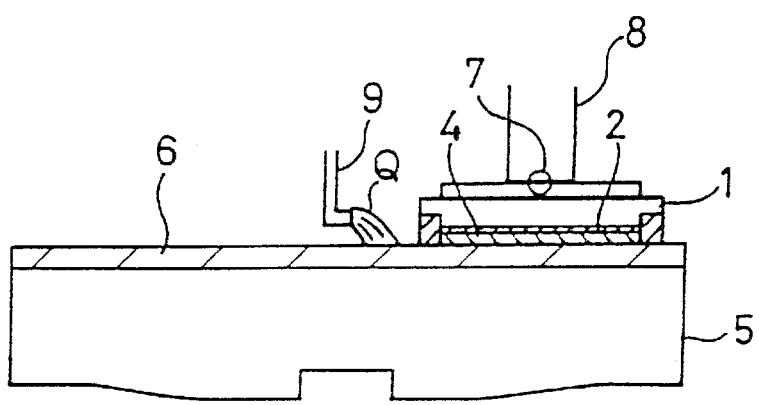

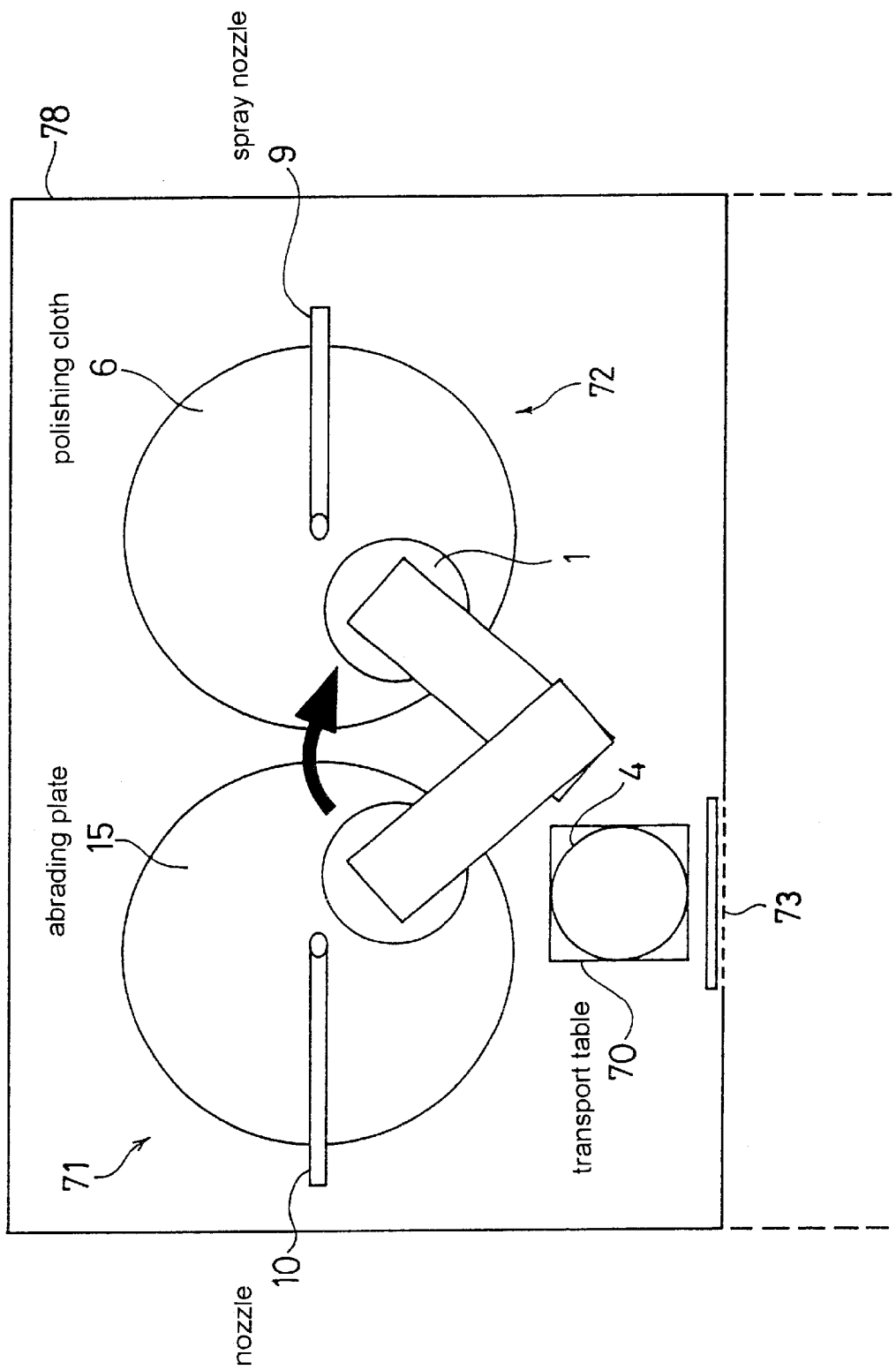

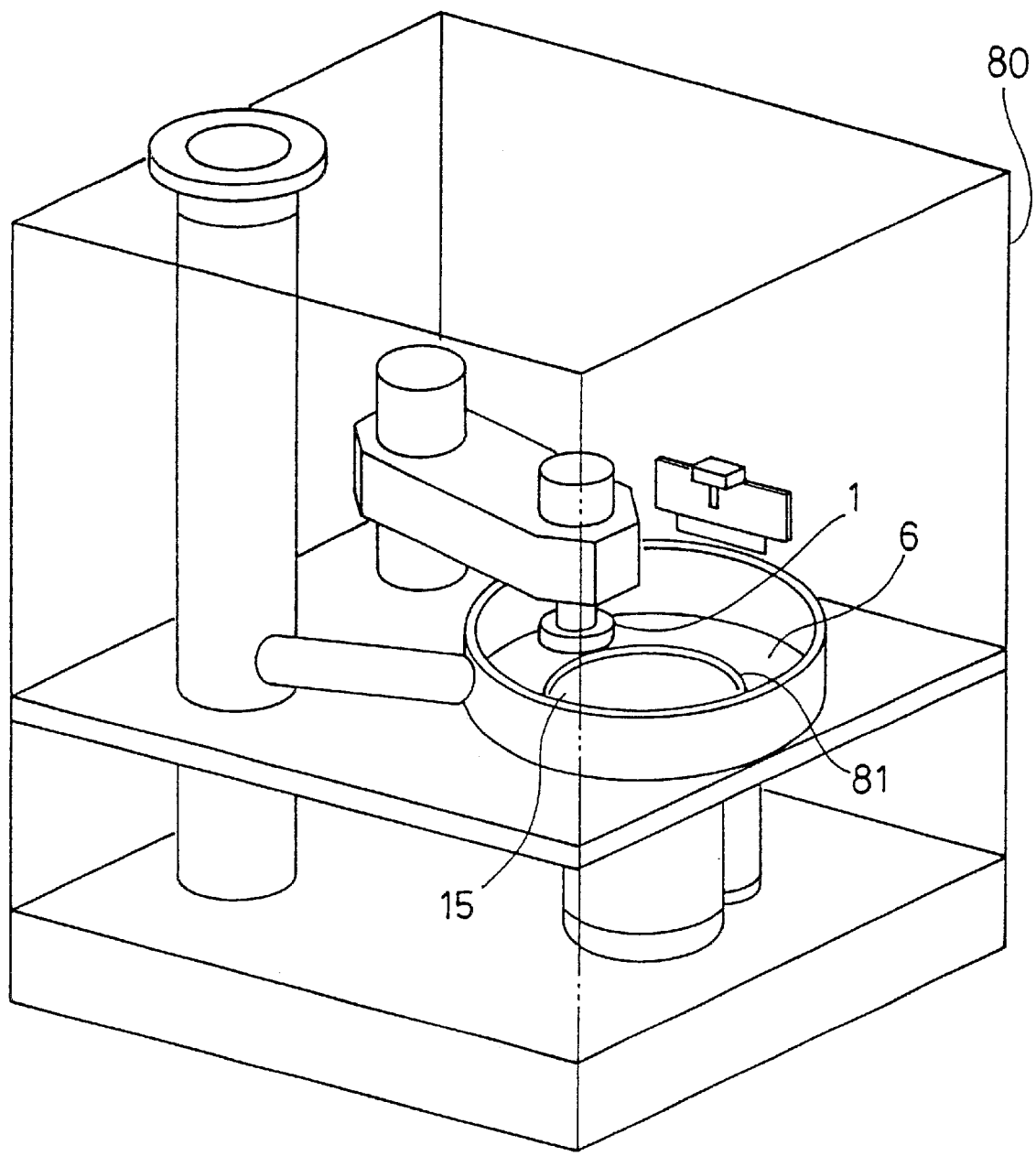
F I G. 28

ABRADING PLATE AND POLISHING METHOD USING THE SAME

TECHNICAL FIELD

The present invention relates to an abrading plate and a method for polishing an object such as semiconductor wafer using the abrading plate to obtain a flat and mirror finish.

BACKGROUND ART

Recently, as the density of circuit integration in semiconductor devices becomes ever higher, circuit patterns are becoming finer and interline spacing narrower. Especially since the line width becomes finer, the depth of focus of the stepper becomes very shallow in photolithographic reproduction of circuit patterns, and the surface of the wafer placed at the focal plane of the stepper must be flat to produce the required degree of image sharpness. A method of obtaining a flat surface is to polish the object in a polishing apparatus.

A type of conventional polishing apparatus comprises a turntable having a polishing cloth and a top ring which is pressed against the turntable with a given pressure while the polishing object is held therebetween, and supplying a polishing solution to the interface to produce a flat and mirror polished surface. This approach is called chemical mechanical polishing (CMP).

FIG. 1 shows essential parts of an example of a conventional CMP apparatus. The apparatus is provided with a rotating turntable 5 having a polishing cloth 6 such as a urethane cloth; a top ring 1 holding an object 4 such as a semiconductor wafer 4 against the cloth 6; and a spray nozzle 9 for supplying a polishing solution Q to the polishing cloth 6. The top ring 1 is connected to a top ring shaft 8, and the top ring 1 holds a semiconductor wafer 4 in contact with an elastic mat 2 such as polyurethane. The top ring 1 has a cylindrical guide ring 3 on its outer periphery so that the wafer 4 would not be disengaged from the bottom of the top ring 1. The guide ring 3 is fixed to the top ring 1, and the wafer 4 is held within the holding surface so that the wafer 4 would not jump outside of the top ring due to frictional forces with the cloth 6. The top ring 1 is supported on a spherical bearing 7 so that it can be tilted with respect to the shaft 8.

While holding the wafer 4 in the bottom surface of the elastic mat 2 of the top ring 1, wafer 4 is pressed against the cloth 6 on the turntable 5, and the turntable 5 and the top ring 1 are independently rotated so as to slide the surface of the wafer 4 relative to the cloth 6 to polish the wafer 4. In this case, a polishing solution Q is supplied from the nozzle 9 to the top surface of the cloth 6. The polishing solution comprises abrasive particles, for example, such as silica particles, suspended in an alkaline solution, which has two effects of CMP for a semiconductor wafer, chemical polishing using an alkaline solution, for example, and mechanical polishing using abrasive particles.

However, the conventional polishing methods of CMP using such a slurry solution containing numerous abrasive particles presents two operational problems.

The first problem is that, during the initial stage of polishing, raised regions of the surface structure are preferentially removed, but gradually, depressed regions are also removed. Therefore surface irregularities are difficult to decrease. It is considered that this phenomenon in CMP is created because a relatively soft cloth is used along with freed abrasive particles contained in the polishing solution, so that not only the raised portions, but also the depressed portion of the surface structure, are removed by such abrasive particles. FIG. 2 illustrates such problems of the conventional CMP, which shows irregularities caused by a raised portion and depressed portion of surface film thickness structure on the vertical axis and relative time on the horizontal axis. As indicated in this graph, at a relative time of 1 to reach a stage of surface removal, the raised regions are polished from a height of about 27,000 angstroms to a height of 16,000 angstroms, but the depressed regions are also polished from 20,000 angstroms to 16,000 angstroms, at which point the irregularities are eliminated. FIG. 3A shows surfaces profiles of a fine surface structure in an initial stage, FIG. 3B in a middle stage, and FIG. 3C in a final stage of polishing. As illustrated in these drawings, the irregularities are very difficult to be removed, and consequently, it is a time-consuming operation.

The second problem relates to cost and environmental considerations. The polishing solution is usually a slurry containing a fine silica powder in suspension, but to obtain a uniformly flat surface of high quality, it is necessary to supply the solution in a liberal quantity to the polishing surface. However, most of the solution supplied is actually discharged as a waste solution without contributing much to the polishing process. Polishing solutions used for high precision polishing of semiconductor devices are expensive, which is a factor leading to a problem of high polishing cost. Also, because such polishing solution in a slurry condition contains a large quantity of abrasive particles such as silica particles, the maintenance of the working environment is apt to be difficult. That is, contamination of the solution supply system and drainage system by the slurry is serious, and the waste solution must also be treated extensively before discarding it. Also, after a CMP process, the wafers are washed to remove the polishing solution, but the waste water from this operation also must be treated in a similar manner and poses an environmental problem.

DISCLOSURE OF INVENTION

To solve the above described problems, it is therefore an object of the present invention to provide an abrading plate and a method using the abrading plate for preferentially removing only the raised regions in a patterned semiconductor wafer having fine irregularities fabricated on the surface, with, when the irregularities are eliminated, the abrading plate having a self-stopping function to stop polishing automatically.

Another object of the present invention is to provide a polishing method and an apparatus using the abrading plate which easily enables additional polishing to remove a certain film thickness uniformly after a height difference is eliminated by polishing.

To achieve the objects of the present invention, there is provided an abrading plate which comprises abrasive particles having a chemical purity of not less than 90% (preferably higher than 94%) and a particle size of not more than 2 μm (preferably less than 0.5 μm); a binder material; and a given volume of porosity, wherein a ratio of the abrasive particles and the binder material is 1:x, where x is not less than 0.5 by volume (the binder material per 1 unit of the abrasive particles is not less than 0.5 unit), and proportions of abrasive particles, a binder material and porosity are, respectively, not less than 10%, not more than 60% and 10–40% by volume.

According to the present invention, the abrading plate thus produced has an optimized composition of particles, binder and porosity by volume, so that raised regions of the polishing surface is preferentially removed from the object surface and depressed regions are not removed. Therefore, after the raised regions are flattened and the surface has become level, continued polishing will not proceed to change the film thickness of the surface structure. Stopping or removal rate reduction is achieved automatically, and is termed a self-stopping capability. If the abrasive particles are in excess or the binder material is insufficient, abrasive particles are easily self-generated (released), so that abrading continues even after a level surface has been produced, and the self-stopping function cannot operate. If the amount of abrasive particles is insufficient or binder material is in excess, abrasive particles are difficult to be self-generated (released) and the polishing rate is reduced so that the polishing capacity is decreased. A similar tendency applies to porosity, and it is preferred to have a porosity 10~40% by volume or more, preferably 15~30% by volume, to give the self-stopping capability to the abrading plate. In other words, too much porosity makes the abrading plate too soft and promotes generation of released particles, while too little porosity makes the abrading plate too hard to discourage self-generation of freed particles (released). Because the particles are less than 2 $\mu$m in size, the chances of scratching the wafer are reduced, but it is preferable to use particle sizes of less than 0.5 $\mu$m.

In general, the polishing rate is increased by having a large number of released abrasive particles in the sliding interface. When there are a lesser number of freed abrasive particles, the polishing rate is reduced, and a wafer processing ability, namely throughput, is reduced. Accordingly, when the surface of the semiconductor device patterned wafer having raised and depressed regions is polished by the abrading plate, a high surface pressure is applied to the raised region of the wafer by the abrading surface of the abrading plate, thus the raised portion bites and shaves the abrading surface of the abrading plate to release the abrasive particles through an initial stage to a final stage of the polishing. A large number of abrasive particles are released and produced during the polishing stage, and thus polishing proceeds at a relatively large polishing rate by the released abrasive particles. Therefore, in the final stage of polishing, when the surface has become level, the wafer has few raised regions left on the wafer to bite into the abrading plate so that a lesser number of released particles are produced from the abrading plate. During polishing, the sliding interface shifts its location constantly, and the residual released abrasive particles are lost from the sliding interface. Thus, the amount of the released abrasive particles remaining on the sliding interface becomes extremely small, and polishing action stops eventually to thereby provide a self-stopping function, which occurs as an extreme decrease of the polishing rate.

In the abrading plate, proportions of abrasive particles, a binder material and porosity should be 10~60% (preferably 20~50%), 30~60% (preferably 35~55%), and 10~40% (preferably 15~30%) by volume, respectively, to achieve a self-stopping capability as described above.

It is preferable that an abrading plate is comprised of abrasive particles having a chemical purity of not less than 90% (preferably higher than 94%); and it is preferable that the abrading plate be comprised of such particles, a binder material and porosity. Accordingly, the abrading plate made by such abrasive particles that can be obtained easily will present little danger of contaminating device wafers (patterned wafers).

A method is presented for polishing a semiconductor device wafer, having fine surface structure fabricated on a polishing surface, using an abrading plate. The method includes the conditioning steps of: dressing an abrading surface of the abrading plate so as to produce a roughened structure on the abrading surface; removing released particles attaching to the roughened structure; and polishing the polishing surface with a conditioned abrading plate having a stabilized polishing rate generated by the foregoing steps. According to the method, the characteristic feature of the self-stopping function of the present abrading plate can be fully effective to be utilized in polishing the semiconductor device wafer.

Also, the present method of polishing of a semiconductor device wafer having fine structures fabricated on its surface includes a feature that an abrading surface of an abrading plate is dressed to produce a micro-rough surface, and released abrasive particles attached to the abrading surface are removed before pressing onto a surface of an object to be polished, so that the abrading surface has reached a stabilized condition to polish a blanket wafer (a wafer covered by an overall film) at a sufficiently low polishing rate. This procedure is effective in generating the self-stopping capability.

Also, the present method of polishing of a semiconductor device wafer having fine structures fabricated on its surface includes a feature that additional surface removal is performed with an abrading plate using a liquid not containing any abrasive particles for a specific duration, followed by additional polishing using a slurry containing abrasive particles to the surface to be polished. A specific duration is a duration sufficient for the surface to be leveled by removing the high and low spots. According to this method, it enables the use of the same abrading plate to obtain additional surface removal by using a slurry containing a large amount of released abrasive particles. Because this polishing is carried out using a slurry containing a large amount of abrasive particles, surface removal can be achieved in a relatively short time to obtain a desired film thickness.

Also, the present method of polishing of a semiconductor device wafer having fine structures fabricated on the surface includes a feature that the additional surface removal is performed using an abrading plate and a liquid not containing any abrasive particles for a specific duration, followed by additional polishing using released abrasive particles being produced from concurrent dressing of the abrading plate. This method enables the use of the same abrading plate so that the released abrasive particles, being produced by carrying out dressing concurrently with the polishing by the abrading plate, are used to obtain quick removal of the surface material, thereby raising the polishing rate. Therefore, it is not necessary to have an additional facility such as the polishing solution supply device so that a regular facility based on the abrading plate can be used to perform additional surface removal.

Also, the present method of polishing of a semiconductor device wafer having fine structures fabricated on its surface includes a feature that additional removal is performed using an abrading plate and a liquid not containing any abrasive particles for a specific duration, followed by additional polishing using a polishing cloth and a slurry containing abrasive particles. This method enables the use of an existing facility to carry out additional surface removal based on a conventional slurry and polishing cloth.

BRIEF DESCRIPTION OF DRAWINGS

FIG. 2 is a graph of polishing characteristics of the apparatus shown in FIG. 1.

FIGS. 3A~3C are illustrations of the surface steps produced by the apparatus having the polishing characteristics shown in FIG. 2.

FIG. 6A shows a plan view of a scroll mechanism and 6B shows a cross sectional view along a plane A—A in FIG. 6A.

FIG. 8A shows a case of large sized particles and FIG. 8B shows a case of small sized particles.

FIG. 12 is a graph to show the polishing characteristics of an abrading plate having no self-stopping capability.

FIGS. 13A~13C are illustrations to show surface elevations obtained by the abrading plate shown in FIG. 12.

FIGS. 15A, 15B are schematic illustrations of the dressed abrading surface, and FIG. 15A shows a case of a large number of residual particles, and FIG. 15B shows a case of a negligible number of residual particles.

FIGS. 16A~16C are comparisons of various abrading plates: FIG. 16A is with self-stopping; FIGS. 16B, 16C are without self-stopping. The graphs on the left column show transitions in polishing rate, with polishing time on x-axis and polishing rate on y-axes; the graphs in the middle show transitions in film thickness, with polishing time on x-axis and film thickness on y-axis; and the graphs on the right column show comparison of initial (D1) and last (D2) stages of polishing of a blanket wafer (BL) and a device wafer.

FIG. 17A shows a brush method; FIG. 17B shows a roll brush method; FIG. 17C shows a water jet method; and FIG. 17D shows an ultrasonic method.

FIG. 19 is an illustration of the changes in film thickness during the first stage polishing and the second stage polishing.

FIGS. 20A, 20B are illustrations of a method of controlling the film thickness, and FIG. 20A shows time based control and FIG. 20B shows thickness based control.

FIG. 22 is a flowchart of the switching process for changing from a liquid W to a slurry Q.

FIG. 25 is a flowchart of the switching process for the dressing operations.

FIGS. 26A, 26B are illustrations of a method of polishing in a third embodiment.

FIG. 27 is a plan view of an example of the polishing apparatus suitable for the methods presented above.

FIG. 28 is a perspective view of another example of the polishing apparatus suitable for the methods presented above.

BEST MODE FOR CARRYING OUT THE INVENTION

In the following, preferred embodiments will be presented with reference to the drawings.

Figure 1:
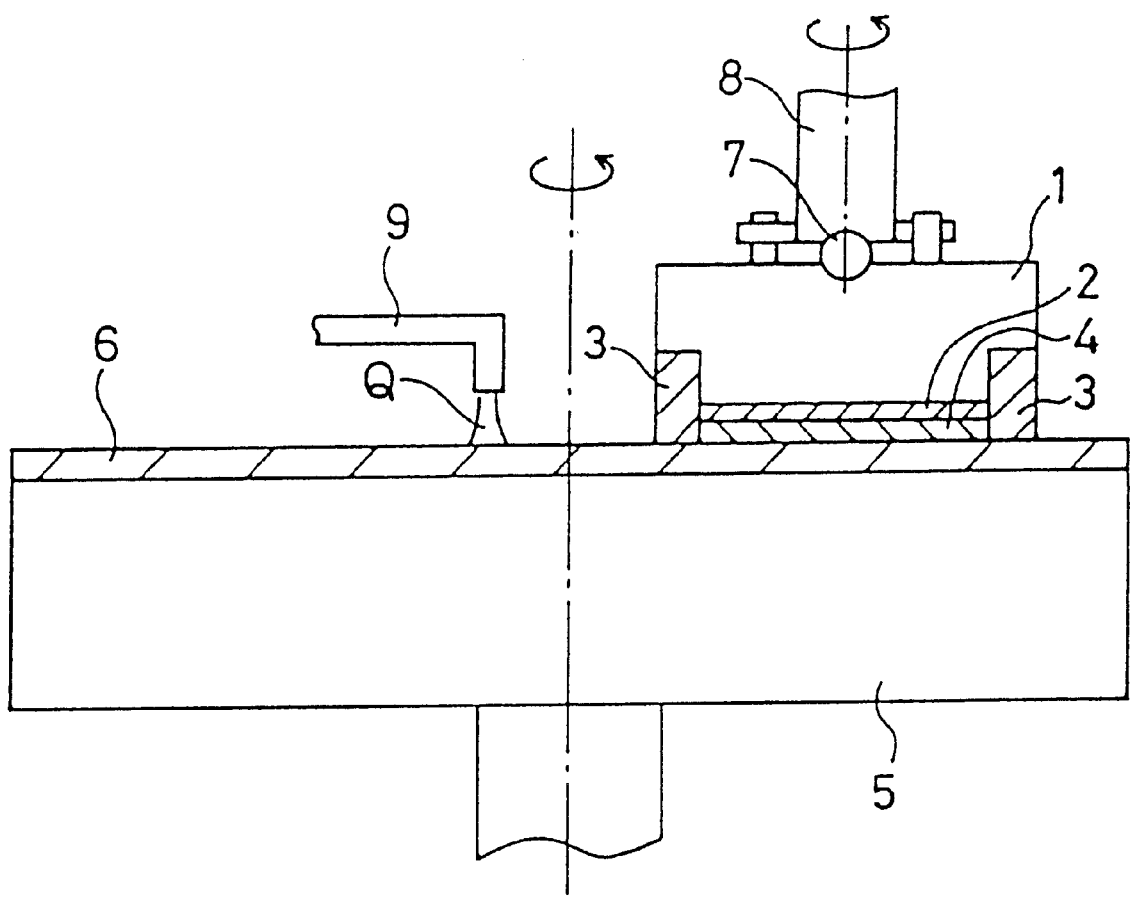
FIG. 1 is a schematic cross sectional view of a conventional polishing apparatus.
Figure 4A:
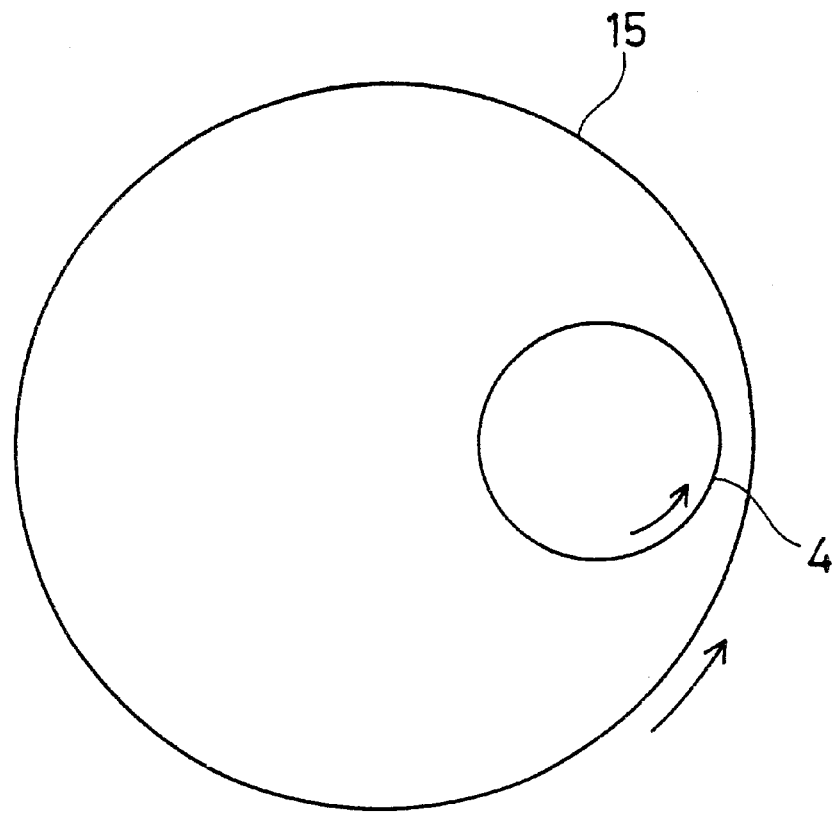
FIGS. 4A, 4B are schematic diagrams of the essential parts of an embodiment of the turntable type polishing apparatus of present invention, and shows a plan view in FIG. 4A and a cross sectional view in FIG. 4B.
Figure 4B:
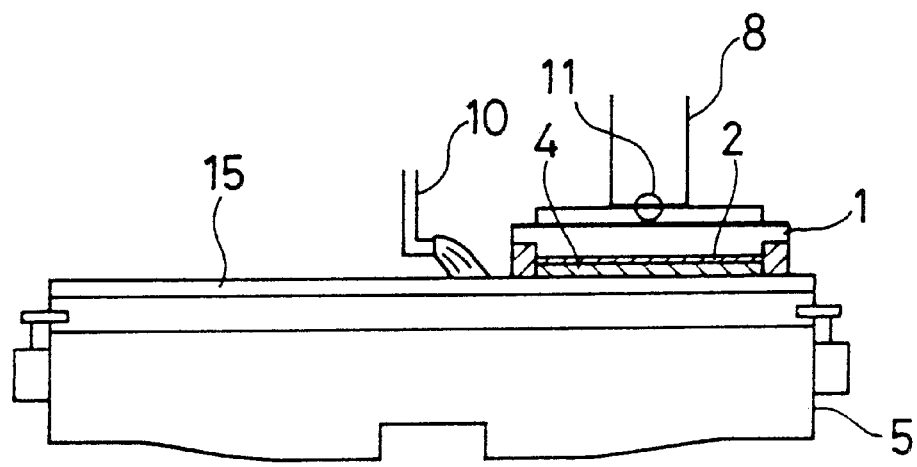

FIGS. 4A and 4B show an example of the polishing apparatus of the present invention. The apparatus comprises: a turntable 5 having an abrading plate 15 of about 60 cm diameter in stead of a polishing cloth thereon; a nozzle 10 for supplying water or an active solution W without abrasive particles during polishing. Other components such as top ring 1 for holding a wafer 4 are the same as those in the conventional apparatus shown in FIG. 1. The reason for supplying a polishing solution W such as water or an active solution is to provide lubrication at the sliding interface, to promote chemical reactions at the sliding interface, and to remove heat generated by polishing for cooling. Water or active solution W includes acid solutions with pH down to about 1, alkaline solutions with pH up to about 12, buffer solutions, surface activators, oxidizing solutions, reducing solution, ultrapure water, and electrolytic ionized water and the like. As an example, the flow rate of water may be 200 ml/min. Water may be ultra-pure water so as to exclude impurities. Wafer 4 as an object of polishing is pressed against the abrading surface of the abrading plate 15 through an elastic mat 2 placed in the top ring 1, and rotated by the drive shaft 8. The turntable 5 with mounted abrading plate 15 is also rotated independently, and the abrading surface of the abrading plate 15 forms a sliding interface with the surface of the wafer 4 on which polishing action takes place between the sliding and pressing surfaces.

The polishing apparatus shown in FIG. 4 has an abrading plate instead of a polishing cloth used in the conventional apparatus. But polishing apparatus for polishing the object using the abrading plate to obtain a flat and mirror finish can also be used, and such types include a scroll type or cup type other than the turntable type.

The scroll type polishing is based on holding the wafer in a wafer-holding device and an abrading plate bonded to a base disk, and the two parts are slid in a circular and translational motion relative to each other. The cup type polishing is based on a cup-shaped plate or a ring-shaped plate held in a plate-holding device and the wafer is firmly attached to the base disc. The polishing surface of an object is pressed against the abrading surface of the plate and scrolled to produce a polishing action. In these types of apparatuses also, it is possible to use a self-stopping function to stop polishing automatically when the irregularities have been eliminated.

Figure 5:
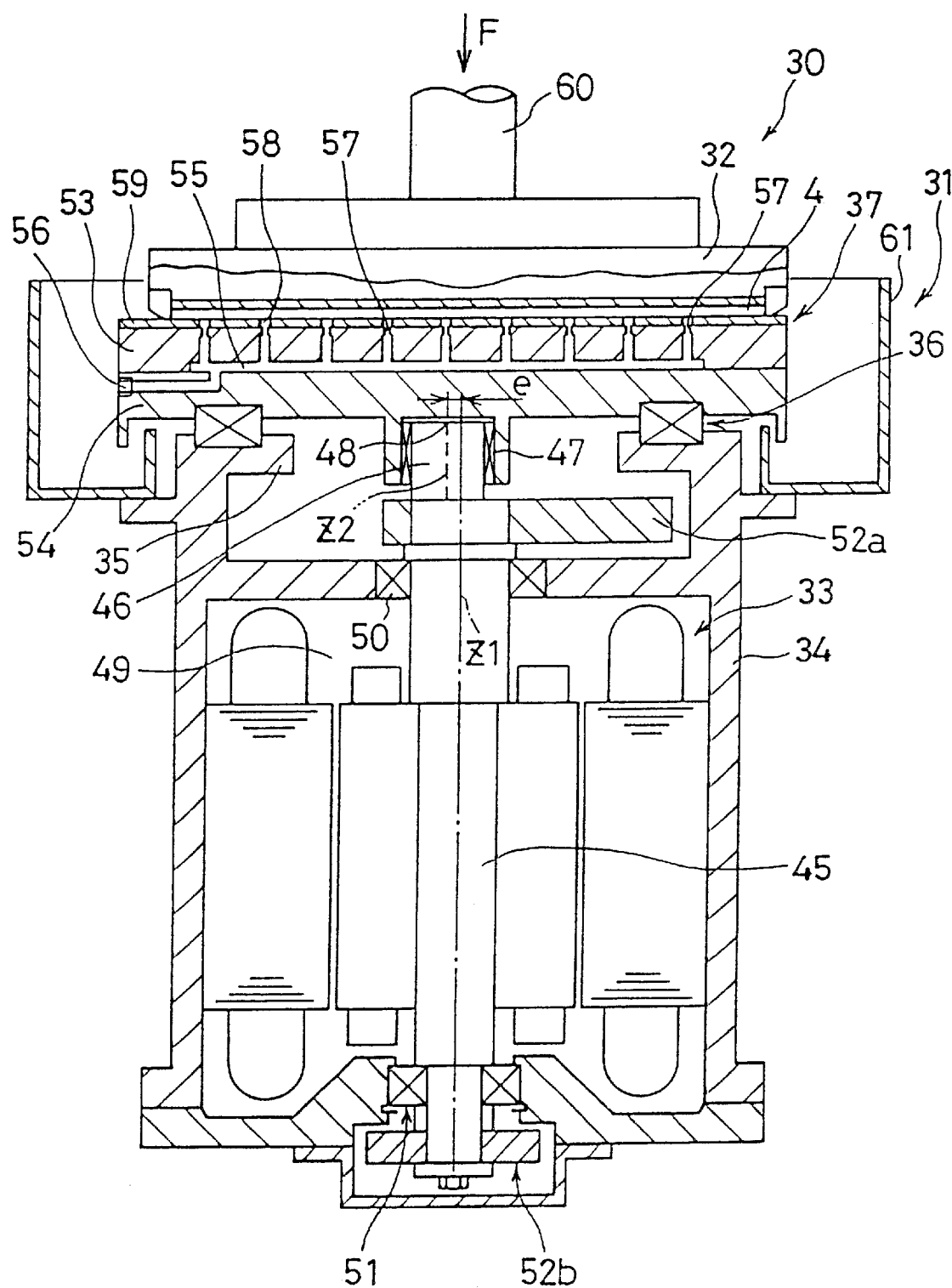
FIG. 5 is a cross sectional view of a scroll type polishing apparatus of present invention.
Figure 6A:
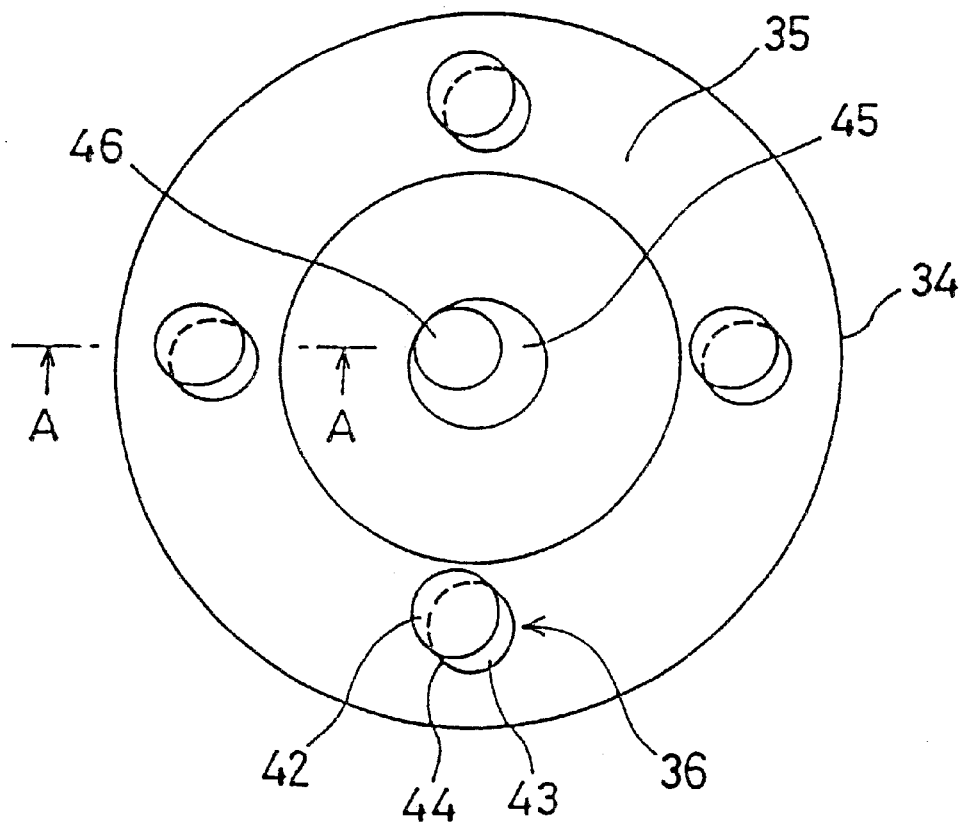
FIGS. 6A, 6B are schematic diagrams of the essential parts of an embodiment of the scroll type polishing apparatus shown in FIG. 5, respectively.
Figure 6B:
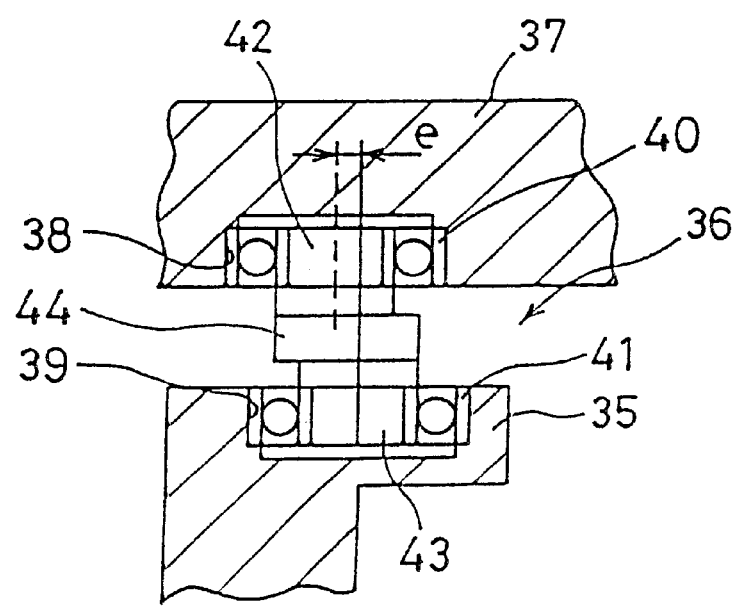

FIGS. 5 and 6A, 6B illustrate a circular and translational motion mechanism of a scroll type polishing apparatus. Circular (or circulative) and translational motion means that two surfaces only produce translational motion with circular or the like movement without changing the relative orientation. In such a design, the abrading plate needs to be only slightly larger than the substrate to be polished. Therefore, it is possible to easily produce an abrading plate of a highly flat surface, and the drive motor can be small, and thus the apparatus can also be made smaller and compact so as to save floor space. The apparatus is comprised of a translational table section 31 to provide circular and translational motion, and a top ring 32 for holding a wafer 4 with its polishing surface facing downward to press the polishing surface thereof against the abrading surface of the plate.

The translational table 31 is supported at three or more peripheral locations by a support plate 35, extending inside in a ring-shape, provided with a support section 36 at the top of a casing 34 housing a motor 33 inside to support a fixed disk 37. The top surface of the support section 36 and the bottom surface of the fixed disk 37 are provided with corresponding depressions 38, 39 spaced apart evenly in the circumferential direction, housing respective bearings 40, 41. Bearings 40, 41 are connected by a connecting member 44 whose shafts 42, 43 are separated by a distance "e", as shown in FIG. 6, and whose ends are inserted into the respective bearings. The fixed disk 37 thus undergoes a circular and translational motion along a circle of radius "e".

The fixed disk 37 is rotated by the motor 33, whose shaft 45 has an offset drive pin 46, which in turn is inserted in a cavity 48 through a bearing 47. The offset amount is the same as the distance "e". The motor 33 is housed in the motor chamber 49 in the casing 34, and the shaft 45 is supported by top and bottom bearings 50, 51, and is provided with balancers 52a, 52b to counter balance the offset.

The fixed disk 37 has a radius which is slightly larger than the wafer 4 by the offset amount "e", and includes two bonded disk members 53, 54. The two disk members form a space 55 between the disks for conducting water or solution to be supplied to the polishing interface. The space 55 communicates with the solution supply hole 56 formed on the side surface and communicates also with a plurality of liquid outlets 57. The fixed disk 37 has an abrading plate 59 bonded to its top surface. Liquid outlets 58 formed on the abrading plate 59 correspond to the discharge holes 58 formed on the fixed disk 37. These discharge holes 57, 58 are normally distributed evenly across the fixed disk 37 and abrading plate 59.

The top ring 32 serves as a pressing tool for the wafer 4, and is attached to the shaft 60 so as to permit tilting with respect to the polishing surface of the wafer 4. Top ring 32 is operated by an air cylinder (not shown), and is rotated by the drive motor via the shaft 60. The wafer 4 is attached to a base holding section of the top ring 32 with an elastic mat intervening between the two surfaces. The casing 34 has a solution recovery trough 61 attached to its outer surface at the top.

The process of polishing using the polishing unit will be explained below. The motor 33 is rotated to operate the fixed disk 37, and the wafer 4 attached to the top ring 32 is pressed to the abrading surface of the abrading plate 59 bonded to the fixed disk 37. Polishing liquid is supplied to the polishing interface through the liquid supply hole 56, space 55 and discharge holes 57, 58, and is delivered to the polishing interface through the grooves fabricated on the surface of abrading plate 59.

Here, a circular and translational motion of a radius "e" is generated between the surfaces of the abrading plate 59 and the wafer 4 so as to produce uniform polishing on the entire surface of the wafer 4. In this case, when the positions of the object and abrading surface are fixed, local differences in the nature of the abrading surface will affect the polished surface, and to avoid such an effect, the top ring 32 is slowly rotated by itself so that polishing is not performed in the same spot.

The abrading plate used in the apparatus has a self-stopping capability, which stops polishing automatically when the irregularities are eliminated from the polishing surface. Abrasive particles may be an ultra-fine powder of cerium oxide ($CeO_2$), and the binder is a polymeric resin such as polyimide or phenolic.

Abrasive particles may include $SiO_2$, $Al_2O_3$, $ZrO_2$, $MnO_2$ and $Mn_2O_3$, in addition to $CeO_2$. Binders may include other polymeric resins such as urethane, epoxy, polyvinyl alcohol resins, in addition to polyimide or phenol resins. The choice is determined by the nature of the films formed on the semiconductor wafer, and compatibility of the abrasive particles with the binder.

Figure 7A:
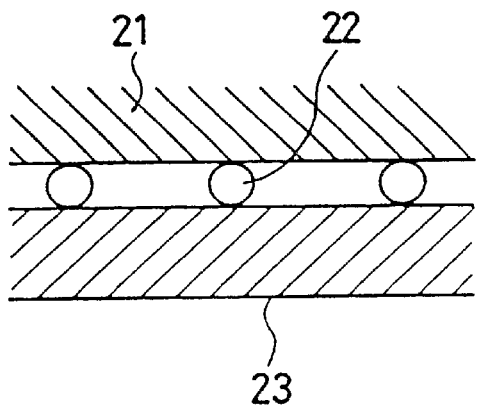
FIG. 7A is a schematic illustration of abrading plate, abrasive particles and polishing surface.
Figure 7B:
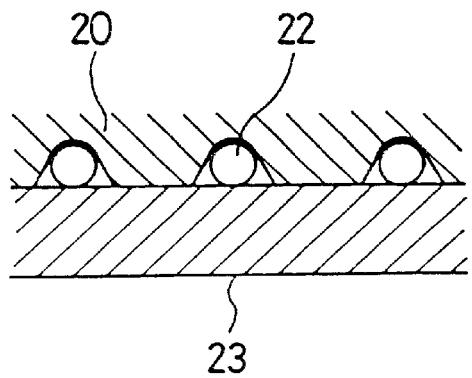
FIG. 7B is an illustration of the relationship of the polishing pad, abrasive particles and a polishing surface of a substrate.

The abrading plate has a very high hardness (extremely high elastic coefficient), and therefore, the size of the abrasive particles directly affects the extent of the surface damage compared with normal CMP using a polishing-pad. For example, as shown in FIG. 7B, normal polishing-pad 20 is soft compared with an abrading plate 21 so that a vertical load will force the abrasive particles 22 into the wafer 23 while the pad 20 itself touches the wafer 23. In other words, the pressing force is distributed over the pad so that the stress does not become concentrated on the abrasive particles 22. In contrast, in the case of abrading plate 21, as shown in FIG. 7A, the abrading plate 21 is considerably harder than the pad 20 so that it tends to not touch the wafer, and the pressing force is almost totally loaded on the abrasive particles 22. In other word, the stress applied on each abrasive particle 22 is higher than that in the CMP process, and naturally the surface damage can be more severe.

Figure 8A:
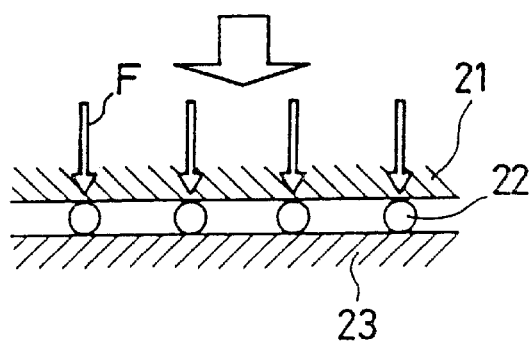
FIGS. 8A, 8B are illustrations to show the effects of particle size on the stress distribution.
Figure 8B:
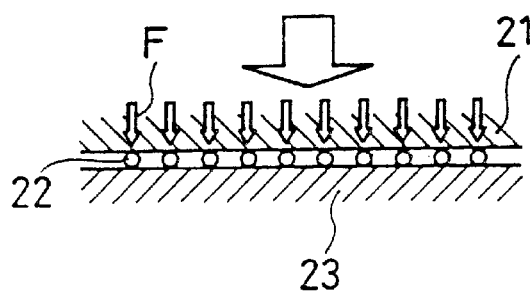

A remedial step is to increase the number of abrasive particles 22 so that each abrasive particles 22 is applied with a reduced stress. For example, if the particle size is reduced by ¼ to 0.5 $\mu$m from 2.0 $\mu$m, the number of particles filling a given area increases by 16 fold, as shown in FIGS. 8A, 8B, and a simple estimate is a reduction in stress of 1/16 on each abrasive particles 22. It is therefore desirable to reduce the size of the abrasive particles. The effect of fine particle size on reducing the surface damage is more important than in the case of normal CMP. From such a viewpoint, it is desirable that the size of the abrasive particles be less than 2.0 $\mu$m and more preferably less than 0.5 $\mu$m.

The abrading plate is used inside the cleanroom so that it is important not to include impurities therein. Impurities (especially metallic substances) adversely affect the performance of semiconductor devices. The metal content in a polishing slurry has particularly severe effects on the device quality, whereas metal oxides in the abrasive particles may also dissolve in acid or alkaline solution to produce ions.

Metallic substances in ionic states in the slurry solution can diffuse into an insulating $SiO_2$ (oxide) surface film and reduces the insulating qualities of the film. Also, residual metallic contamination on cleaned wafers also poses problems, because they can affect the next process and contaminate the cleanroom. Therefore, it is desirable that the metal contents in the abrasive particles (metals other than the main particle constituent) be kept as low as possible. For example, in the case of $CeO_2$, the purity is normally less than 50%, but there are no cases that an abrading plate uses abrasive particles of higher than 90% purity. For slurries which are used for normal CMP, metal group impurities, for example Fe, are contained at a level of 60 ppm, and they can remain even after washing the surface of the semiconductor wafer. When the Fe content is limited to less than several ppm, normal washing is sufficient to remove the contamination. Therefore, by using abrasive particles having more than 90% purity (preferably higher than 94%), contamination by metallic impurities can be avoided. Additionally, Na has a particularly adverse effect on the device performance so that the Na concentration in the abrasive particles should be kept below 100 ppm.

The relationship between the size of abrasive particles ($CeO_2$) and the severity of scratches was investigated experimentally. The abrading plates are fabricated by using abrasive particles of $CeO_2$ having average particle sizes of 1.3 $\mu$m and 0.4 $\mu$m. As a binder, polyimide binder is used. The abrading plates are fabricated by a dry pressure shaping method with heat treatment. The results shows that the severity of damage (number of scratches) caused by 0.4 $\mu$m abrasive particles was 1/10 of that caused by 1.3 $\mu$m abrasive particles. Polishing performance was about the same for both sizes, thus indicating that a finer abrasive particle size is preferable.

It is considered that polishing is performed primarily by the action of abrasive particles fixed in the abrading plate against the raised regions of the wafer, as well as by the action of the free abrasive particles released from the plate in the sliding interface. In the polishing method using an abrading plate, because the abrading plate is comparatively harder than the conventional polishing-cloth (polishing-pad), the abrading surface of the plate will touch only the raised regions of the wafer at a comparatively higher stress, and thus a high surface pressure applies to the raised regions. The result is that detachment of abrasive particles occurs by the action of the raised regions of the wafer shaving the abrading surface of the abrading plate. The particles released from the matrix of the abrading plate will further induce polishing action on the polishing surface. When the irregularities are eliminated, the number of released particles will become less, and because the sliding interface is shifting along with the motions of the top ring and the turntable, there will be fewer residual abrasive particles remaining in the sliding interface. The polishing rate is thus reduced and the self-stopping function of the abrading plate is performed.

According to the polishing method by abrading plate, polishing is carried out without a slurry solution containing a large amount of abrasive particles. Therefore, an expensive special polishing solution is not needed, the polishing cost can be reduced, and spent solution can be treated without problems so that environmental problems are reduced. Also, consumable polishing cloth is not needed, further contributing to reducing the polishing cost.

Figure 9:
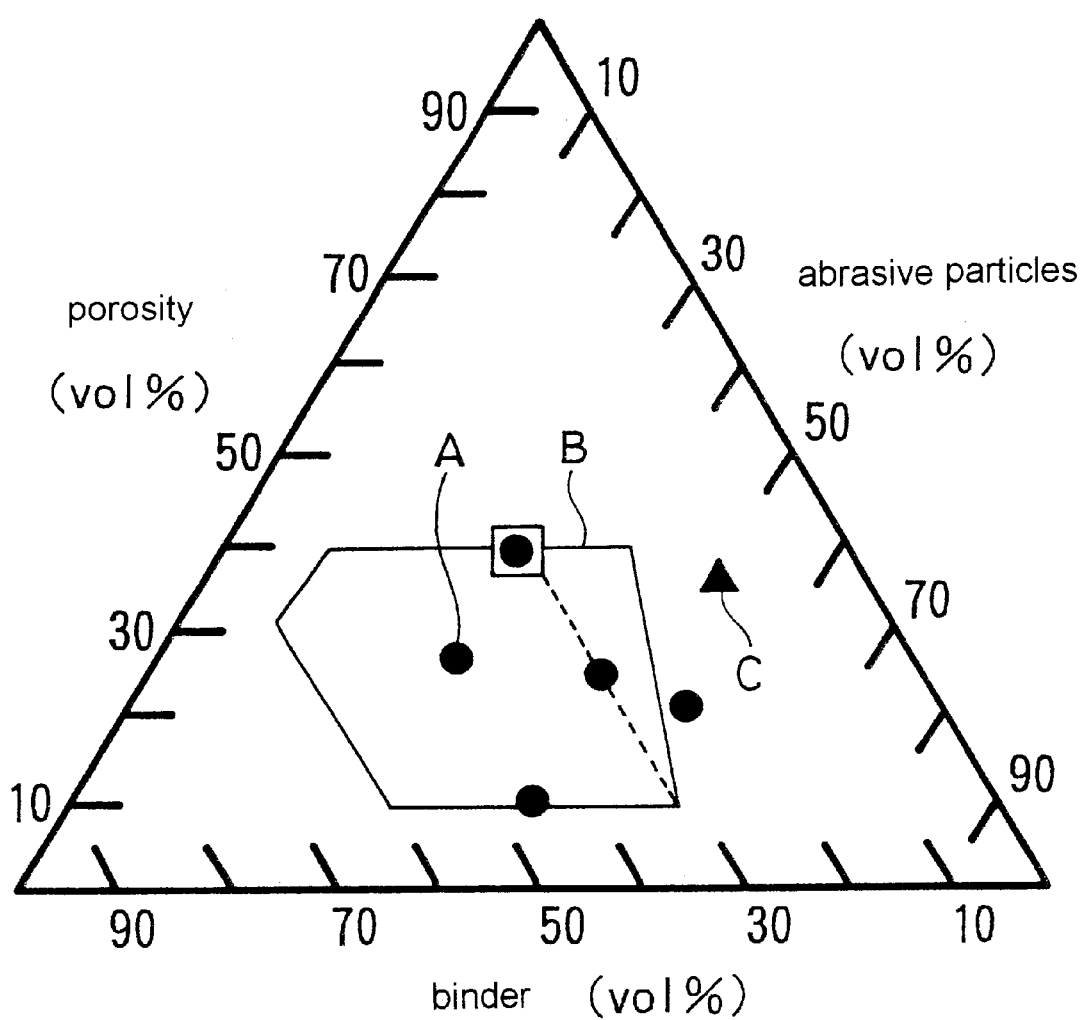
FIG. 9 is a tri-axial graph of abrading plate parameters involving abrasive particles, binder and porosity (volume ratio) to indicate a region B of parameters for optimum performance for self-stopping.

FIG. 9 shows a tri-axial composition diagram in volume percent of abrading plate, showing an optimum area of abrasive particles, binder and porosity for producing abrading plates having a self-stopping capability, obtained by experiments. Filled triangles represent phenol binders, filled circles represent polyimide binders and unfilled squares represent urethane binders. Abrasive particles are $CeO_2$.

Experimental results show that the abrading plates made in the proportion shown within an area B will exhibit good self-stopping capability. That is, abrasive particles should be more than 10% and should be less than twice the binder volume. When the abrasive particle volume is more than twice the binder volume, freed abrasive particles are likely to be self-generated, and the excessively increased freed particles in the sliding interface interfere with the self-stopping function. Also, such an abrading plate exhibits high wear, lacking in mechanical strength. Such an abrading plate is also difficult to manufacture, because of the tendency to form cracks during the abrading plate shaping operation. On the other hand, when the volume of the abrasive particles is less than 10%, released particles are reduced, thus reducing the polishing rate, and lowering throughput of manufacturing semiconductor devices.

The volume of binder should be more than half the abrasive particles volume and less than 60% by volume (%) of the overall volume. When the binder volume is less than half of the abrasive particles volume, the particle-retaining strength in the matrix is reduced and abrasive particles are more readily seld-generated from the abrading plate, thereby losing the self-stopping function. Such an abrading plate is prone to wear and becomes brittle. When the binder volume exceeds 60%, the particle-retaining strength is increased too much, few freed abrasive particles are generated, and the polishing rate is reduced. Also, the mechanical strength of the abrading plate becomes too high, and increases the danger of causing damage on the surface of the semiconductor wafer.

The amount of porosity should preferably be 10~40%. When the porosity is less than 10%, the binder volume is too high, causing the particle-retention to become too strong, whereby freed abrasive particles are not formed, and the polishing rate is reduced, as discussed above, losing the self-stopping function. When the porosity increases beyond 40%, the mechanical strength of the abrading plate is reduced, the abrading plate becomes brittle, and wear resistance is lowered as a whole. Too many abrasive particles are created and the self-stopping function is again not effective. The area bounded by B represents a volume of abrasive particles 10~60%, binder 30~60%, and porosity 10~40%. It is preferable that the composition in volume be in ranges of abrasive particles 20~50%; binder 35~55%; and porosity 15~30%.

FIGS. 10 and FIGS. 11A, 11B, 11C show the results of polishing a semiconductor device patterned wafer having raised and depressed regions with a self-stopping function produced by an abrading plate made with the composition represented by point A in FIG. 9. The particles were $CeO_2$ and the binder was polyimide mixed in a ratio of particles: binder: porosity at 30:45:25, respectively. As shown in these results, raised regions exhibited a height of more than 20,000 angstroms initially, and within 1 relative time unit, the height was reduced to less than 15,000 angstroms. This height was maintained even when polishing was continued for another 2 time units so that the height of the raised and depressed regions remained the same. Namely, only the raised regions are polished, and the depressed regions are not polished. It is thereby easy to obtain flat surface structure by eliminating irregularities between raised regions and depressed regions of the semiconductor device wafer. After that, even if polishing is continued, the film thickness is kept unchanged, and the polishing process thus achieves the self-stopping function, such that material removal is automatically controlled after a level surface has been attained. Thus, a polishing time based control task becomes easier, and the allowable range of processing (the process window) is widened. The film thickness in the depressed regions is maintained at the original thickness so that design of the film thickness is facilitated. Also, if there are some regions that are being polished slowly, those regions which have already been polished are not subjected to further polishing while waiting for the slow regions to catch up. When the slow regions are polished, the overall surface attains a single level and uniform flatness.

Figures 11A, 11B, 11C:
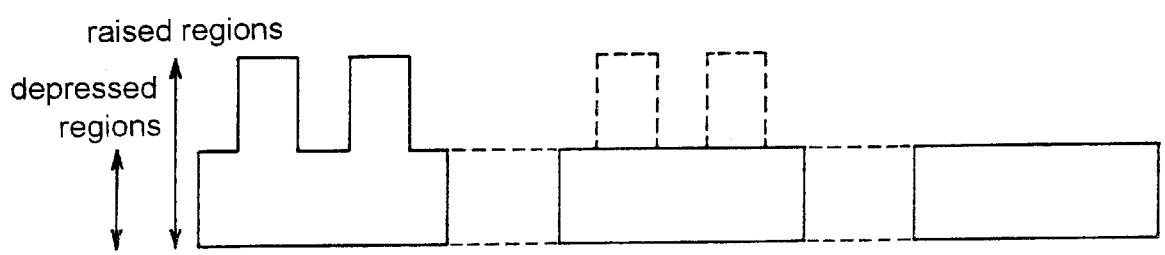
FIGS. 11A~11C are illustrations of progressive changes of irregularities during polishing according to the polishing characteristics of abrading plate shown in FIG. 10.

FIGS. 11A–11C illustrate the changes in the profile of the surface structure. FIG. 11A shows an initial stage, FIG. 11B shows a middle stage (time 1), and FIG. 11C shows the final stage of polishing (time 2), respectively. As illustrated, only the raised regions are polished in relative time 1 to produce a level surface, which remains unchanged even when polishing is continued to time 2.

FIG. 12 shows the results obtained using an abrading plate, indicated by point C in FIG. 9, that does not have the self-stopping function with a particle: binder: porosity ratio at 50:15:35, respectively. The progress of polishing is illustrated in FIG. 13A for an initial stage (time 0), FIG. 13B for a middle stage (time 1), and FIG. 13C for a final stage (time 2), respectively.

In this case, the abrading plate is made with a low binder volume. Consequently, the abrading plate is brittle and abrasive particles are easily released from the abrading plate shown in FIG. 9. Until time 1, raised regions are preferentially polished and the depressed regions are hardly polished. Therefore, a level surface can be obtained easily, but polishing continues to be active even after a level surface has been reached because of the abundance of released particles. Therefore, at time 2, the height of the wafer is now reduced as a result of the continued polishing. For this reason, although the irregularities are easily eliminated, polishing is continued so that the allowable range of processing (the process window) is narrowed, i.e., polishing control becomes much more difficult. Furthermore, because the rate of material removal is different before and after achieving a flat surface, it is difficult to control the polishing time properly.

Figure 14:
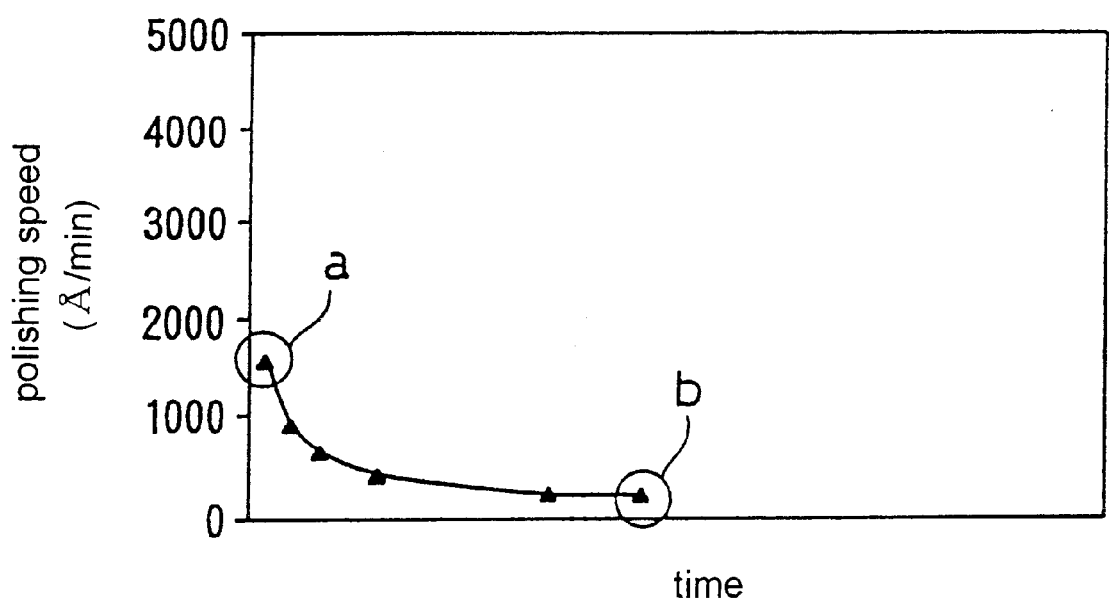
FIG. 14 is a graph to show changes in the polishing rate of the abrading plate after dressing (roughening) of the abrading plate surface.

FIG. 14 shows polishing characteristics of a freshly dressed (roughened) abrading plate on a blanket wafer having no fine-structures fabricated on the surface. Polishing rate (in Å/min) is plotted on the vertical axis and polishing time of the dressed abrading plate after dressing in hours is plotted on the horizontal axis. It can be seen that the rate of material removal by the freshly dressed (roughened) abrading plate shown in "a" is high, because of the abundance of released abrasive particles. When such a freshly dressed abrading plate is applied to a semiconductor device patterned wafer, raised regions of a wafer can be polished at high speed and the irregularities can be eliminated, but polishing action will be continued and lead to a result similar to the results shown in FIG. 12. It is clear that the self-stopping function does not work in this case. Self-stopping means that the irregularities are eliminated and flatness is achieved, and from this point on, further polishing will not produce further material removal, that is, the film thickness is unchanged. This result is equivalent to the result obtained on polishing a blanket wafer having no such patterned fine-structure. Therefore, before using a freshly dressed abrading plate on a semiconductor device patterned wafer, the dressed abrading plate should be conditioned using a blanket wafer to remove abrasive particles and to moderate the initial rapid rate of material removal, so that the self-stopping function can work effectively.

Figure 10:
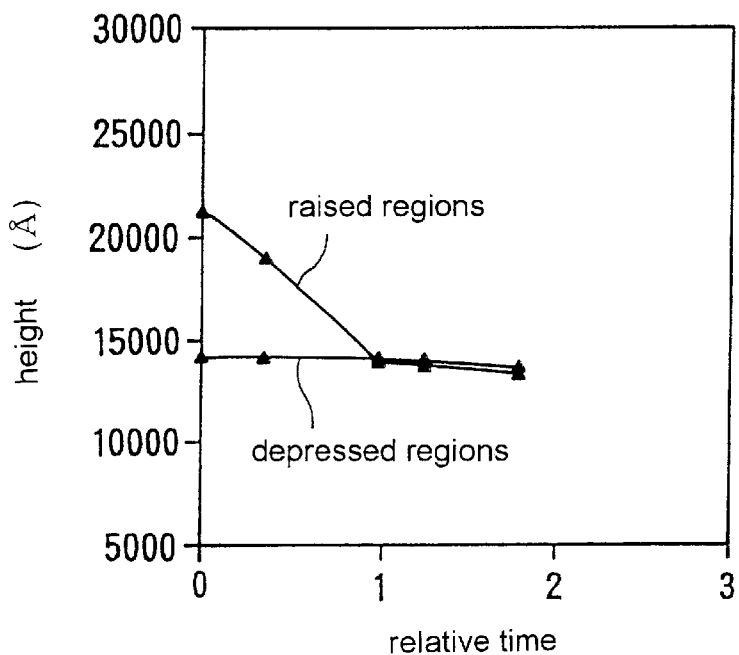
FIG. 10 is a graph to show the polishing characteristics of an abrading plate having self-stopping capability.

That is, before the semiconductor device patterned wafer is polished, the freshly dressed abrading plate should be treated using blanket wafers so that the polishing process is carried out after the polishing rate has been lowered sufficiently as indicated by "b" in the figure, thereby enabling the provision of an abrading plate exhibiting a self-stopping function shown in FIG. 10.

The abrading plate may be manufactured by a dry pressure shaping method with beating treatments involving the steps of mixing the binder and abrasive powder, filling a mold, forming an abrading plate (pressing and beating), cooling, bonding to a base plate, and shaving (planing) of the abrading surface. Planarity of the finished abrading plate is about ±100 µm, but this flatness is inappropriate to polish semiconductor device patterned wafers, because the contact with the polishing surface is only partial and the surface cannot be processed properly. Therefore, semiconductor wafer processing requires, for example, an abrading plate initially dressed by a dresser having diamond particles (#100 or #200 size) electro-deposited in a nickel base. Dressing may be carried out at 400 g/cm² for 10 minutes. This initial operation is called abrading plate shaping. The final surface roughness of the abrading plate for polishing a semiconductor device patterned wafer is preferably less than ±30 µm.

The abrading surface of the freshly shaped abrading plate appears similar to one shown in FIG. 15A where many abrasive particles 22 are found. When a device patterned wafer is polished using an abrading plate having such an abrading surface structure, the polishing rate is very high, as indicated by "a" in FIG. 14. Although leveling can be obtained easily, the material removal process continues even after flatness is achieved as shown in FIGS. 12 and 13. In contrast, when the residual particles 22 remaining on the freshly dressed surface are removed, as shown in FIG. 15A, a device patterned wafer is polished using an abrading plate having a surface structure as shown in FIG. 15B, wherein the particles have been scraped away, and thus the rate of material removal is slower, as indicated by "b" in FIG. 14. When a device patterned wafer is polished in this condition, a level surface is obtained while maintaining desirable irregularities, and after the desired level surface is produced, the abrading plate will exhibit the self-stopping function so that it appears as though material removal has been stopped automatically.

It is thought that self-stopping effect is generated as follows. Fine structures fabricated on a device patterned wafer surface are comprised of many fine raised regions and depressed regions. When such a device patterned wafer is pressed against an abrading surface of an abrading plate, the fine structure acts like a dressing tool, and although the dressing effect is not to the extent that is produced by diamond dresser (size of diamond particle is approximately 100~300 µm), tips of the fine-structure bite into the abrading surface of the abrading plate and scrape out the abrasive particles, producing freed abrasive particles through a soft dressing process. An abrading surface shown in FIG. 15B can hardly abrade the blanket wafer surface, as indicated by "b" in FIG. 14. But when such a relatively clean abrading surface is used to polish a device patterned wafer having raised regions and depressed regions, the effect is almost the same as the abrading plate being soft-dressed to produce an abrading surface structure similar to the one shown in FIG. 15A. The roughened abrading surface, being produced by the device patterned wafer, can release abrasive particles which are effective in leveling the fine-structure of the device patterned wafer. When leveling is achieved, the device wafer surface becomes effectively similar to that of a blanket wafer, and the profile of the abrading plate changes to a structure similar to the one shown in FIG. 15B, which no longer produces any more released abrasive particles. The process then stops because of the self-stopping effect of the abrading plate structure.

It should be noted that the self-stopping feature cannot be produced in any type of abrading plate, and the effects can be different depending on the composition of the abrading plate. Polishing characteristics for a device patterned wafer can be divided into three large categories as shown in FIGS. 16A, 16B and 16C. Differences in the characteristics are made clear by carrying out continuous polishing experiments using blanket wafers with a conditioned abrading plate. Only those abrading plates exhibiting the behavior of rapid initial polishing followed by a lower rate of polishing will exhibit quick elimination of irregularities followed by the self-stopping effect (refer to FIG. 16A). For abrading plates exhibiting high removal rate even after the irregularities are eliminated, self-stopping effects will not be observed (refer to FIG. 16B). The abrading plates exhibiting low removal rate from the beginning are not affected by soft dressing by a semiconductor device patterned wafer, so that particles cannot be scraped out, resulting in almost no material removal and no self-stopping effect (refer to FIG. 16C). The abrading plates that exhibit the type of polishing behavior shown in FIG. 16A are found in the compositional area denoted by B region in FIG. 9. Outside of this compositional area, abrading plates with low binder volume or high porosity volume are relatively soft abrading plates, and their polishing characteristics are represented in FIG. 16B. Abrading plates with high binder volume and low porosity volume are relatively hard abrading plates, and their polishing characteristics are represented in FIG. 16C.

To develop the self-stopping capability of the abrading plate, it is necessary to remove residual particles from the dressed abrading plate before it can be used for polishing a wafer. One method of eliminating the residual abrasive particles is to condition a blanket wafer until the polishing rate stabilizes at some lower rates. This method is based on pressing and rotating the abrading plate against a blanket wafer chucked in a wafer carrier while water flows during conditioning. But the conditioning tool is not limited to a blanket wafer, and any type of tool having a flat surface made of a hard material can be used. For example, a quartz glass substrate or ceramic substrate can be used in the same manner. Such conditioning tools are also chucked in the wafer carrier (top ring) so that the tool should have about the same size and thickness (less than 1 mm) as the wafers. When thicker materials are used, it is necessary to modify the chuck by adding an adapted chuck mechanism having an increased guide ring height, for example. Thus, supply of liquid during conditioning is absolutely essential, and the type of liquid, for example, such as water, should serve to cool the conditioning tool and sweep the released particles away.

Operating parameters when using a blanket wafer, for example, are: rotational speeds of abrading plate table/substrate at 50/35 rpm respectively; pressing pressure for substrate at 500 g/cm$^2$ which is equivalent to wafer polishing surface; water flow rate at 200 ml/min; and total polishing time of 10 minutes approximately.

Figure 17A:
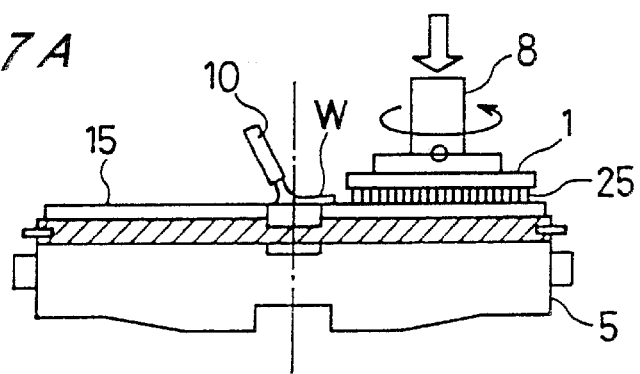
FIGS. 17A~17D are illustrations of the steps for removing residual particles.
Figure 17B:
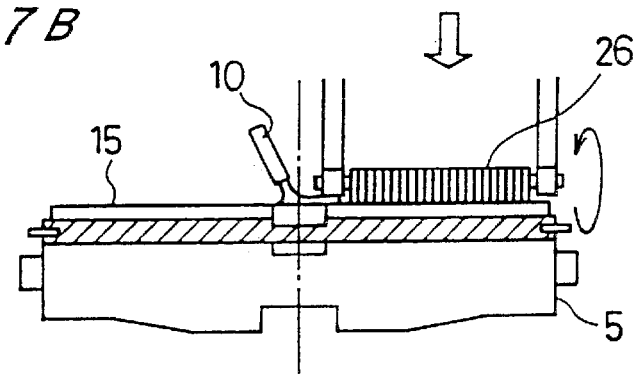

Other methods include a method using a brush 25, instead of the blanket wafer, for washing the abrasive surface 15 with water (refer to FIG. 17A), or a method using a brush roller 26 and water (refer to FIG. 17B). These methods are effective in removing the residual abrasive particles and producing a suitably roughened abrading plate (involving a roughness of less than ±30 μm). Operating parameters are, for example, rotational speeds of abrading plate table/brush at 20/12 rpm, brush pressing pressure at 200 g/cm$^2$, water flow rate at 200 ml/min, and a removing time of 1 minute. Brush 25 should have a relatively soft tip made up of fibers of less than 1 mm diameter, which is rotated and pressed against the abrading surface 15 while providing a liquid W such as water to remove the released abrasive particles.

Figure 17C:
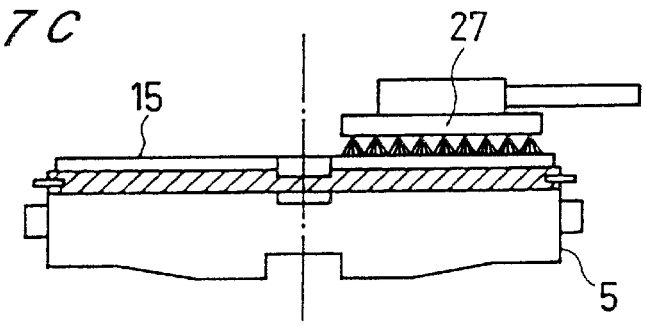
Figure 17D:
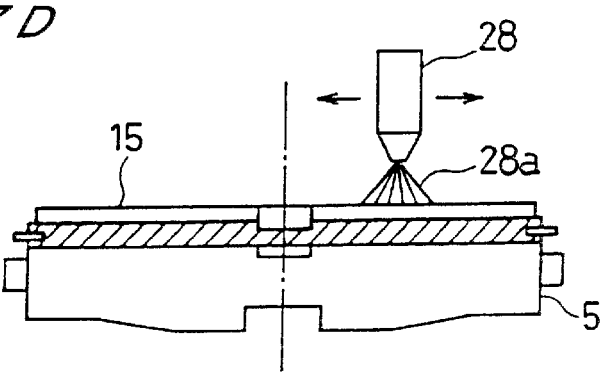

Also, methods based on fluid pressure applied by a water jet 27 (refer to FIG. 17C) or ultrasonic jet 28a ejected from an ultrasonic source 28 (refer to FIG. 17D) are also effective. Water jet 27 should be used at a pressure of less than 5 kPa or more preferably less than 2 kPa to remove the residual abrasive particles and to produce a suitably conditioned abrading plate having a roughened surface (involving a roughness of ±30 μm). Excessively high jet pressure should be avoided because it not only removes the residual abrasive particles, but also fractures the suitably roughened abrading surface to be smoothed, which may negate the dressing effects by the semiconductor device patterned wafer. For the same reason, the operating parameters, such as frequency and intensity, should be carefully selected to operate an ultrasonic jet 28a.

Operating parameters for the particle removal method using ultrasonic fluid are, for example, frequency at 20 kHz, output power at 50 W, a conditioning time of several minutes and a flow rate at 200 ml/min. To effectively treat the entire abrading surface, it is desirable to move the ultrasonic source 28 to reciprocate between the center and the edge of the abrading plate 15 at a separation distance of 1 mm or less than 1 mm. Water jets such as Cabijet and Megajet (trade names) may also be used. These methods are effective in removing the residual abrasive particles to produce a suitably roughened surface of the abrading plate (having a surface roughness of less than ±30 μm). Excessive treatment may not only remove the residual released abrasive particles but also fracture the suitably roughened abrading surface of the abrading plate.

By providing such conditioning treatment to a dressed abrading plate, the polishing rate can be stabilized for a short period of time. However, as polishing is continued, the polishing rate can sometimes gradually decrease, so that the abrading plate may have to be re-dressed. As re-dressing (soft dressing) of the abrading plate is carried out to re-establish moderate roughness of the abrading surface of the abrading plate, which is different from the initial dressing for shaping the abrading surface of the abrading plate as shown before, it should be basically carried out using less severe (soft) parameters with a pressure of less than 100 g/cm$^2$. After such conditioning, residual particle removal is not required, and even if it is required, a short treatment time is sufficient. Re-dressing parameters, for example, are: diamond particles of #200 size; pressure for the dresser of less than 50 g/cm$^2$; and a dressing time of less than 1 minute. According to this condition, it produces an abrading plate having a surface roughness of less than several tens of micrometers.

Next, an outline of the process for manufacturing the abrading plate will be described. In general, the process is a dry pressure shaping accompanied with concurrent heat treatment. This process involves a uniformly mixed powder of abrasive particles and a binder of a given ratio, which is filled into a cavity of a press mold. The mixture is compressed and heated to a certain pressure to produce an abrading plate of required dimensions with concurrent heat treatment. Heat treatment is used to soften the binder to promote adhesion to particles and formation of a strong matrix.

Other methods include a wet method for fabricating the abrading plate. An organic solvent (for example, ethanol) is prepared in a container, and a binder such as polyimide resin (liquid or powder) is dissolved in the organic solvent, to which are added abrasive particles. In this example, abrasive particles, $CeO_2$, are added in a ratio described earlier, and the liquid mixture is stirred with a stirring device to produce a feed mixture having uniformly dispersed abrasive particles.

The feed liquid, having the particles uniformly distributed in the binder, is poured into a tray and heated in a vacuum oven to drive out the volatile liquid at 50° C. for two hours, for example, to produce a solid precursor. The precursor is pulverized to produce a pulverized powder of binder resin adhering to the abrasive particles. This powder is filled in a cylindrical container and pressed from above to produce a solid preform. This pressing operation determines the shape of the abrading plate. The compressed solid preform is heated in an oven to soften (gel) the binder and cause it to fuse to the binder adhering to the neighboring abrasive particles. This process produces a strong abrading plate comprised by abrasive particles bonded to a resin matrix material.

The abrasive particles in such an abrading plate are distributed in the matrix material containing a given amount of porosity (openings), and are inter-connected by the binder. It is thought that the porosity or openings are formed by air, which is incorporated in the pulverized powder during the process of pressure shaping the solid intermediate. Therefore, the volume ratio of the porosity in the matrix can be controlled by the compression ratio in the pressing operation.

It would be evident that, although the embodiments were illustrated using $CeO_2$ and polyimide or phenol resin, abrading plates exhibiting the self-stopping property can be produced using abrasive particles and binders that were not included in the description given.

As described above, the polishing method has an advantage that only the raised regions are quickly removed initially to facilitate planarization, but that by using an abrading plate of a certain composition range, polishing does not proceed further. However, there are cases that require removal of further material to reduce film thickness. Such additional material removal after the surface has become flat cannot be carried out using the polishing method described above. Therefore, the present method of polishing is comprised of two stages: a first stage polishing with the abrading plate; and a second stage polishing to additionally remove the surface material to a desired thickness.

Figure 18A:
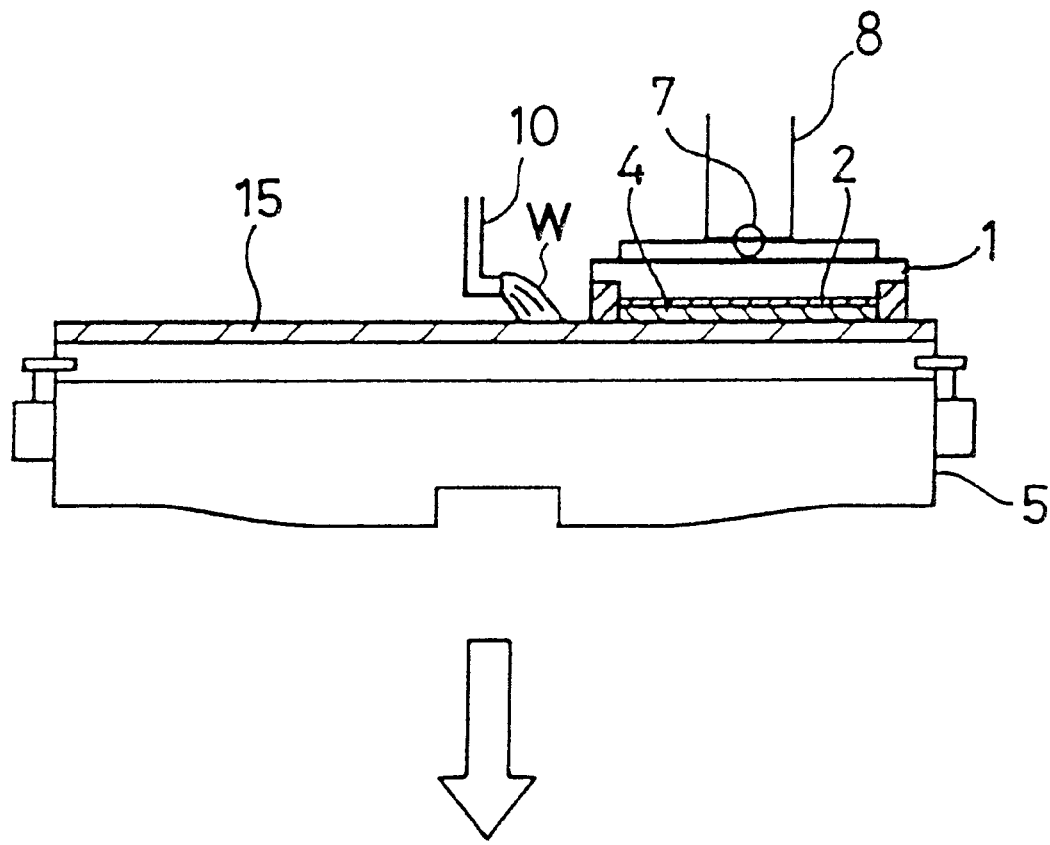
FIGS. 18A, 18B are diagrams to illustrate the method of polishing in the first embodiment of present invention.
Figure 18B:
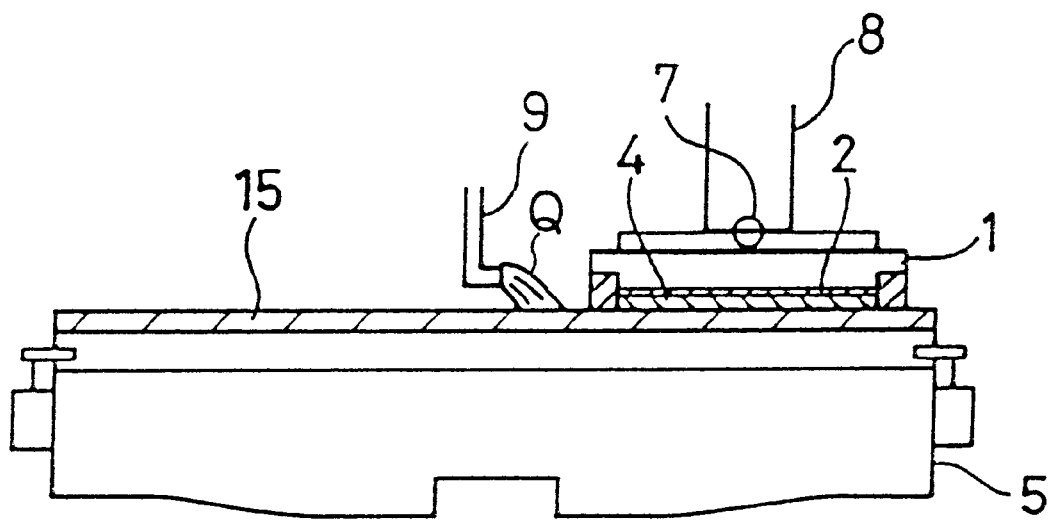

FIGS. 18A, 18B are schematic illustrations of the process of the first embodiment of the present method. The first stage polishing is shown in FIG. 18A, and is based on the polishing using the abrading plate described above. This abrading plate has a self-stopping property that reduces the rate of material removal when the raised regions of the semiconductor device patterned wafer are preferentially eliminated and the irregularities are eliminated by polishing while supplying only water W from the nozzle 10. However, when it is necessary to control the film thickness to a certain value, this abrading plate is not suitable, because further polishing does not remove the surface material due to the self-stopping function.

For this reason, first, the polishing time is controlled so as to recognize that the irregularities have been eliminated.

Then, in second stage polishing shown in FIG. 18B, additional polishing is carried out by replacing water with a polishing slurry containing a large amount of free abrasive particles. Slurry Q of the same type as the ones used for conventional CMP is supplied from the nozzle 9. For example, SC-1 (trade name for the product of Cabot company), which belongs to a colloidal silica group, is suitable. The slurry contains a large amount of normal polishing abrasive particles, and facilitates surface material removal at a high polishing rate, as in the conventional CMP.

FIG. 19 shows steps of the polishing process schematically. The first stage is used only for planarization, and the abrading plate is used to quickly level off the raised regions. After the irregularities are eliminated using the abrading plate, the polishing rate is reduced rapidly, so that the polishing time in the first stage is controlled by allowing some extra time in addition to the time required to eliminate the irregularities. The second stage polishing is aimed to remove a specific amount of surface material, and is carried out by using the same abrading plate with an abrasive slurry supplied from the nozzle in the polishing interface, as shown in FIG. 18B. The polishing rate is determined by the type of abrasive slurry used, so that the desired film thickness Ax can be obtained in a relatively short time. Because this phase of polishing is started from a flat surface, CMP can provide uniform polishing over the entire surface of the semiconductor wafer and a high quality uniformly polished surface can be produced.

A given thickness of residual film can be achieved by time based control and film thickness based control. FIG. 20A shows an example of a time-controlled polishing method using the abrading plate shown in FIG. 18A, and the process is continued to time T1 to produce a flat surface. Accordingly, planarization over the entire surface is achieved. Then, supplying the slurry from the nozzle 9 as shown in FIG. 18B, polishing is continued to time T2. As described above, the polishing time can be determined by the type of slurry being used, therefore it is possible to remove the surface material while continuing polishing to a given time. FIG. 20B shows an example of a film thickness based control method. By polishing the substrate using an abrading plate with the apparatus shown in FIG. 18A, the polishing results in elimination of irregularities to achieve a uniformly flat surface having film thickness A1. Additional polishing using an abrasive slurry is carried out while monitoring the film thickness so as to obtain a film thickness A2 using the apparatus shown in FIG. 18B. Because the process is controlled by monitoring the thickness, an accurate film thickness can be obtained.

Figure 21:
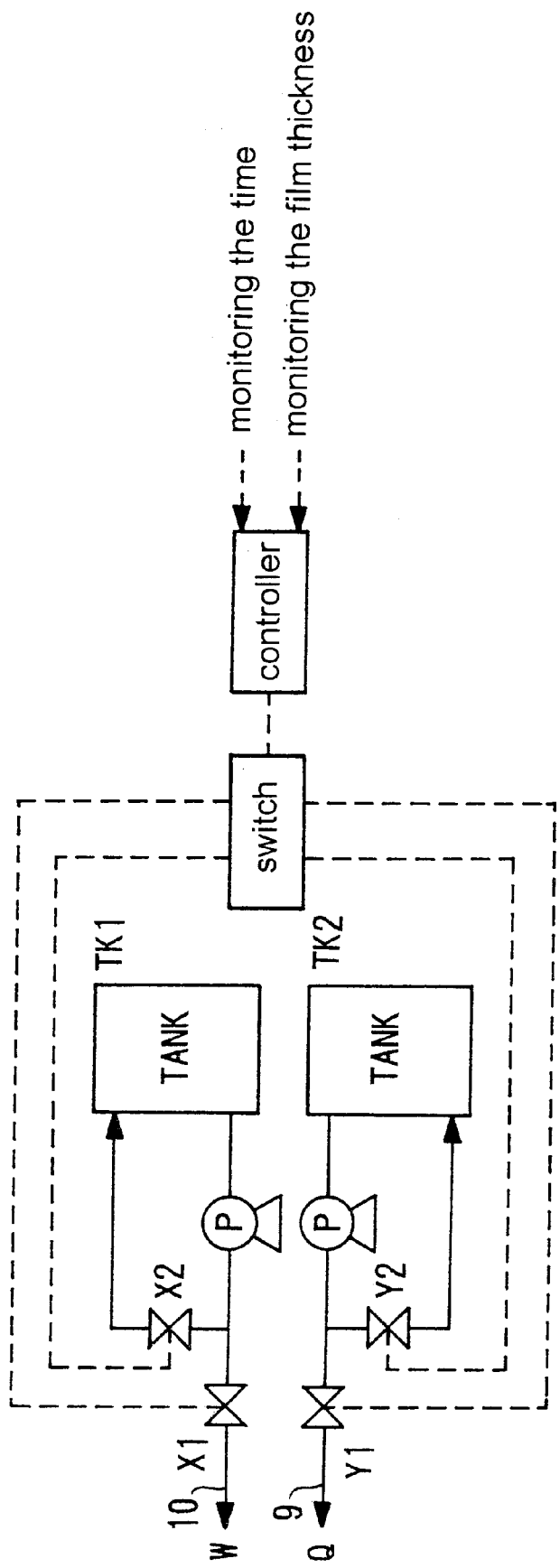
FIG. 21 is a schematic diagram of a switching mechanism for changing from a liquid W containing no abrasive particles to a slurry Q containing abrasive particles.

The process of switching from polishing with "liquid not containing abrasive particles" in the first stage polishing to polishing with liquid containing abrasive particles in the second stage polishing is operated according to a flowchart shown in FIG. 22. The process is controlled by operating the opening and the closing of electromagnetic (em) valves X1, X2, Y1, Y2 shown in FIG. 21. For example, initially the valves are in the initial stage of opening and closing shown in FIG. 22, and the solution is circulated between the delivery piping and the storage tanks (TK1, TK2). In the first stage, each valve is placed in the first stage condition shown in FIG. 22, and polishing is performed using only water W supplied from the nozzle 10. The first stage is controlled based on time, so that when time T1 shown in FIG. 20A has passed, polishing is stopped. The second stage is started after detecting that T1 has passed. The second stage polishing is performed by supplying a slurry Q from the nozzle 9 by operating the valves by a switch so as to be placed as shown in the second stage polishing condition in FIG. 22. The time of ending the second stage polishing is controlled either by time or film thickness, so that the process is ended when time T2 shown in FIG. 20A or film thickness A2 shown in FIG. 20B is obtained.

Figure 23A:
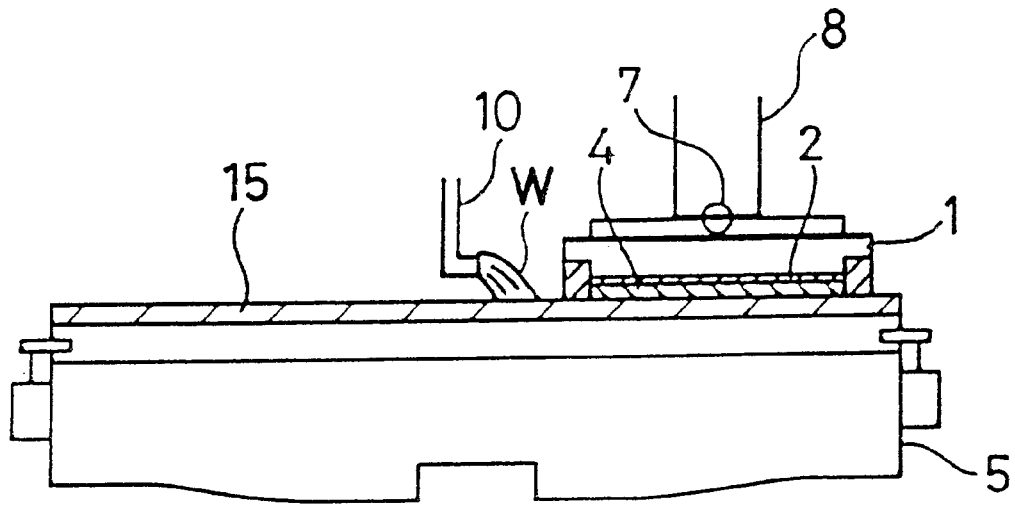
FIG. 23 illustrates a method of polishing in a second embodiment.
Figure 23B:
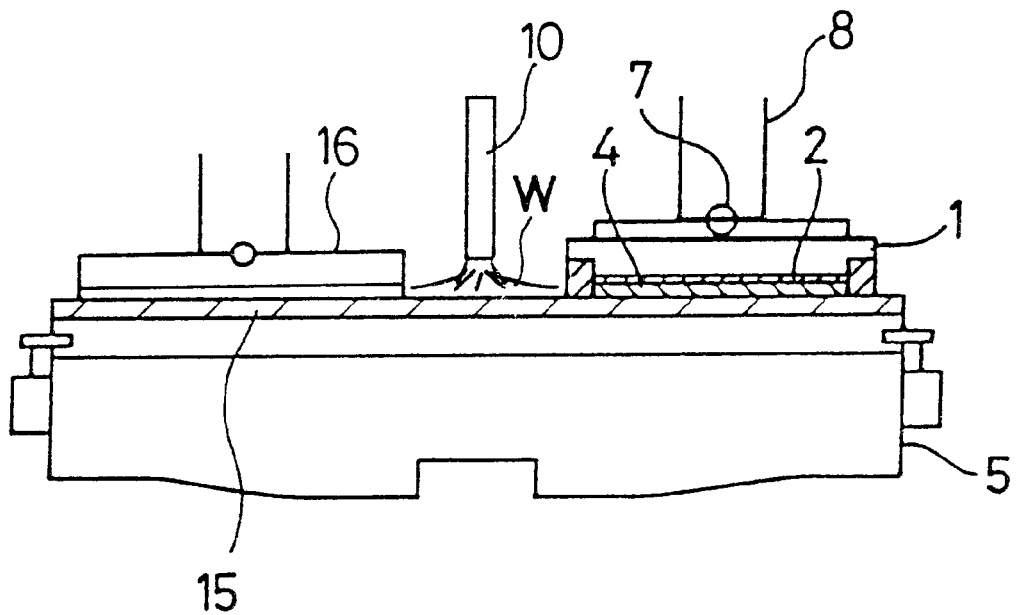

FIGS. 23A, 23B show the second embodiment of the polishing method. FIG. 23A shows a second stage polishing apparatus used for the first stage polishing using the abrading plate, and FIG. 23B shows a polishing apparatus having a diamond dresser 16 added to the apparatus shown in FIG. 23A. Diamond dresser 16 comprises fine diamond particles of about #200 particle size embedded in the abrading surface of the abrading plate 15, and performs conditioning of the abrading plate 15 using water W. As illustrated, on one location on the surface of a rotating turntable 5, polishing of wafer W is carried out by abrading plate, while, on the other location, dressing of the abrading plate is carried out by pressing the dresser 16 on the abrading surface of the abrading plate while supplying water W from the nozzle 10.

Figure 24:
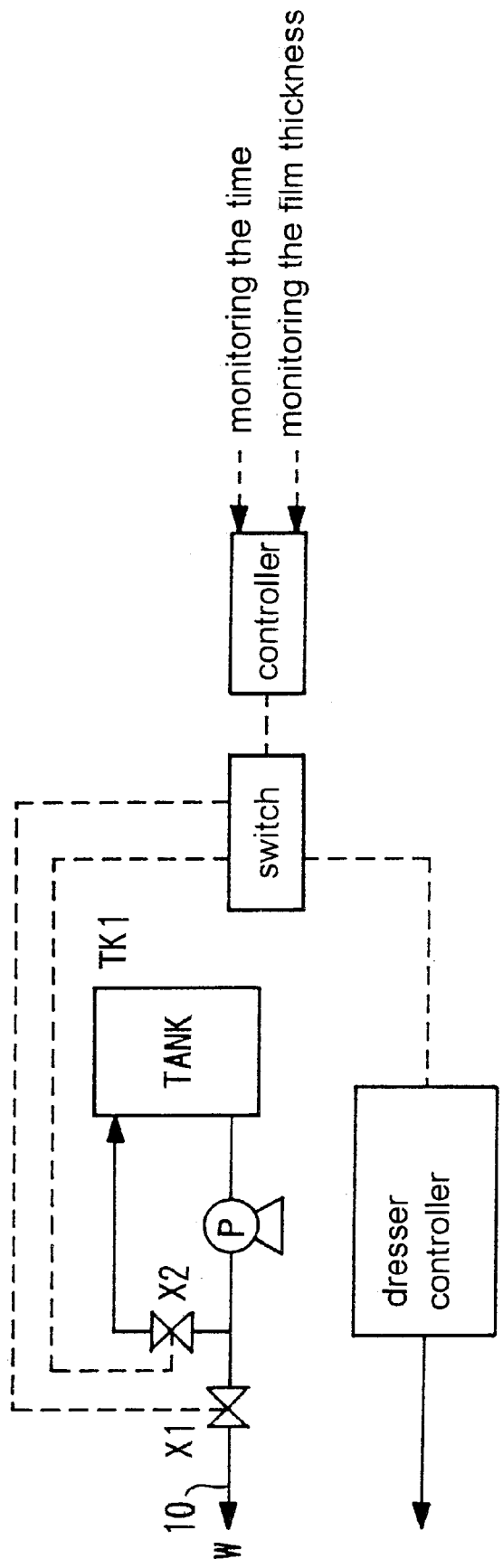
FIG. 24 is a schematic diagram of a switching mechanism for dressing operations.

The first and second stage polishing in the second embodiment are controlled by switching a series of valves using the switching apparatus shown in FIG. 24 according to the flowchart shown in FIG. 25. For example, in the first stage, each valve and the dresser are placed in the first stage condition shown in FIG. 25. First stage polishing is performed using only water W from the nozzle 10 by placing the condition of valves and dresser as shown in the first stage polishing in FIG. 25. The first stage is controlled based on time, so that when time T1 shown in FIG. 20A has passed, polishing is stopped. Thus, the second stage polishing is started after detecting that T1 has passed. The second stage polishing operation with concurrent dressing operation is performed by supplying water W from the nozzle 10 and abrasive particles generated by dresser 16, while placing the valves and the dresser in a second stage condition shown in FIG. 25 with the switching apparatus. General operating conditions for the dresser 16 are approximately: rotational speed of 30 rpm; and polishing pressure of 50 g/cm². The time of ending the second stage polishing is controlled based on either time or film thickness, so that the process is ended at time T2 shown in FIG. 20A or when film thickness A2 shown in FIG. 20B is obtained.

FIG. 26 shows the third embodiment of the polishing method schematically, and FIG. 27 shows a plan view of the apparatus. A wafer 4 that has been through the first stage polishing using the abrading plate 15 shown in FIG. 26A is transferred to a conventional CMP apparatus shown in FIG. 26B using a polishing cloth 6 and slurry containing abrasive particles through a conventional chemical and mechanical polishing process. This CMP operation can be carried out using a single conventional apparatus, but it may be used in a combined manner with the polishing apparatus comprising the abrading plate so that both may be used in a complementary manner. Namely, because of the self-stopping function of the abrading plate using water or chemical solution, surface material removal will not proceed after the irregularities are eliminated in the process of polishing, even in a subsequent polishing process. On the other hand, since polishing cloth of conventional chemical mechanical polishing has elasticity, CMP using slurry will remove surface material from both raised regions and depressed region so that it has a drawback in that height differences are difficult to be reduced rapidly. However, the conventional CMP has an advantage that even a flat surface can be polished at a higher polishing rate, and a highly flat polished surface is obtainable. Therefore, in accordance with a combination of first stage polishing using abrading plate with water or solution without abrasive particles, and second stage polishing using a conventional CMP with a polishing cloth and a slurry including sufficient abrasive particles, a flat surface having a residual film thickness of a desired value can be obtained in an overall short time duration on a substrate surface having irregularities thereon. The process can be controlled, as in the embodiments described above, by the time based control or film thickness based control methods.

FIG. 27 shows an example of an apparatus in which a polishing apparatus 71 using an abrading plate and a polishing apparatus 72 using a polishing cloth 6 are laterally placed in a common polishing room 78. The first apparatus 71 performs polishing using an abrading plate 15 with a self-stopping function while supplying water or chemical solution from the nozzle 10. The second apparatus 72 performs chemical/mechanical polishing with slurry which contains abundant abrasive particles supplied on the cloth 6 from the nozzle 9. In this facility, the wafer 4 is delivered through the delivery opening 73 and is placed on a transport table 70 disposed inside the polishing room 78, and is polished by the apparatus 71 using the abrading plate 15. After the surface has become flat and the height difference is eliminated, the wafer 4 is transferred to the apparatus 72 for additional material removal through a CMP process. In the apparatus 72, an abrading plate can be installed for additional surface removal and finish polishing. The second abrading plate in this case should have finer abrasive particles and higher porosity ratio than the abrading plate 15 in the first apparatus 71 so that the free abrasive particles are more readily self-generated from the abrading surface. The hardness of the binder of the finish abrading plate should be lower than that of abrading plate 15.

Figure 29:
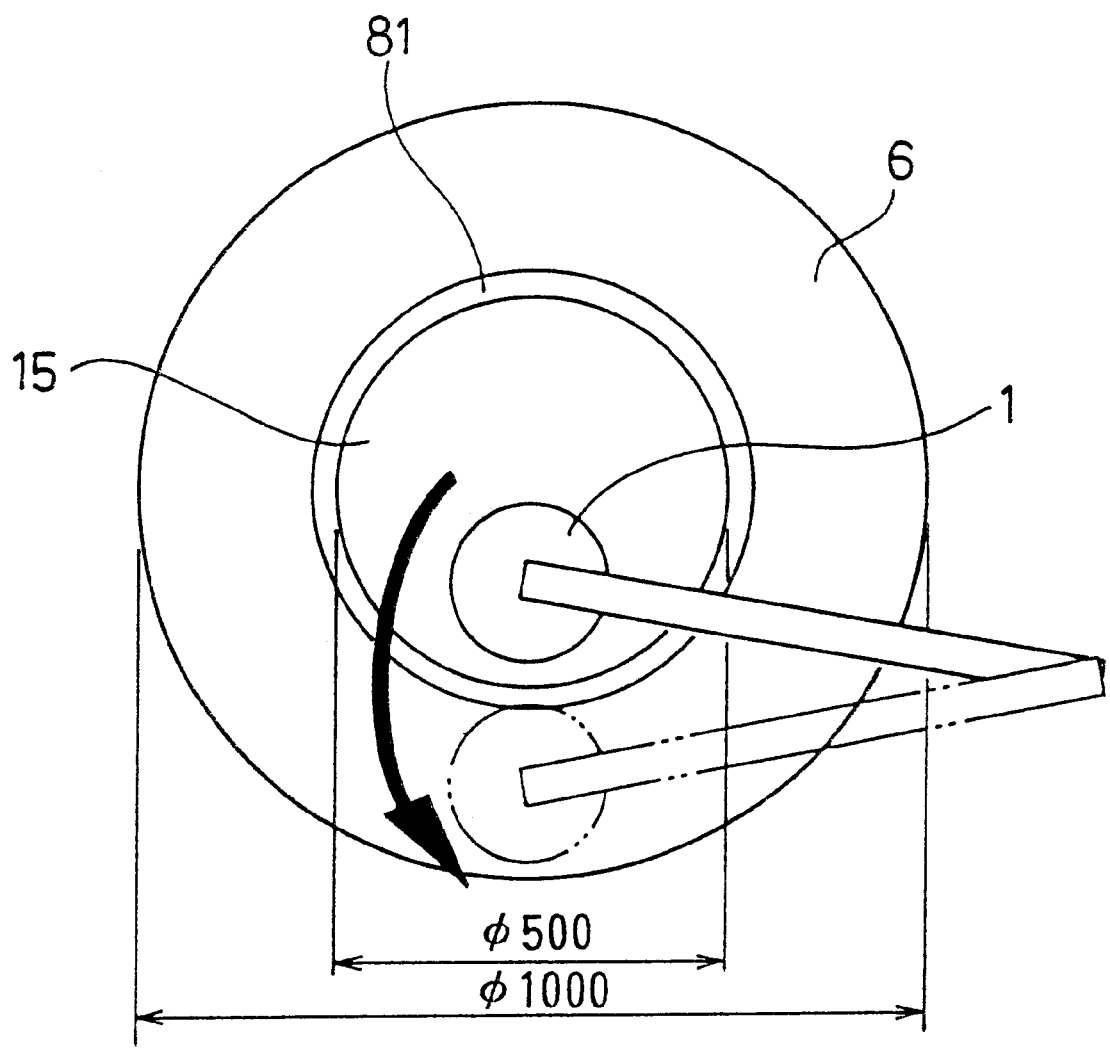
FIG. 29 is an enlarged plan view of the essential parts of the apparatus shown in FIG. 28.

FIGS. 28, 29 respectively show an internal perspective view and a plan view of an apparatus 80 having a turntable having a polishing cloth 6 and an abrading plate 15 which is concentrically disposed therewith. The apparatus 80 performs polishing using the abrading plate 15, and then the top ring 1 carrying the wafer 4 is transferred to the cloth 6. Additional surface material removal and final polish operations are carried out by supplying slurry Q from the nozzle (not shown).

As shown in FIGS. 28, 29, because of the center section and peripheral section created by the concentric arrangement of the abrading plate table and the cloth table, there is no need to provide two turntables, even when first and second polishing stages are involved. The apparatus is compact, and only one motor is required for both operations. Also, as shown in the figures, to avoid mixing of the liquids used for the abrading plate polishing and the cloth polishing, that is, water or chemical solution and slurry, a discharge groove 81 is provided therebetween. In this case, the center section is used for the abrading plate 15 and the outer section is used for the cloth 6, but this arrangement may be reversed so that the center section is used for the cloth 6 and the outer section is used for the abrading plate 15. Also, the center section and the outer section may both have abrading plates, so that surface leveling and additional material removal can be carried out at different abrading plates as needed.

Figure 30:
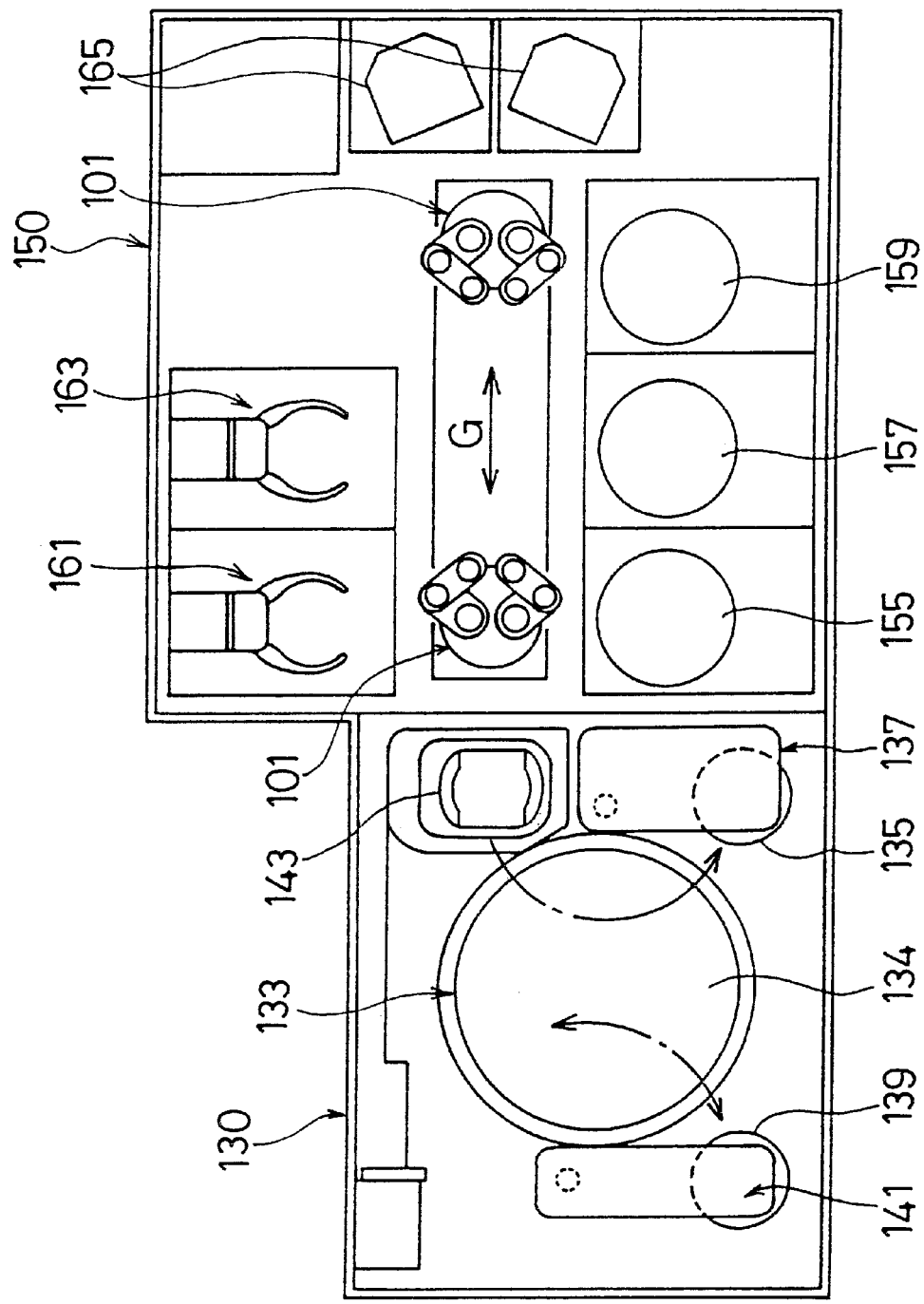
FIG. 30 is a plan view of the overall structure of an example of the polishing apparatus applicable to present invention.

FIG. 30 shows an overall view of a facility which is suitable for an embodiment of the polishing apparatus of the present invention. The apparatus comprises a polishing section 130 and a cleaning section 150. The polishing section 130 is comprised by a centrally placed turntable 133 having the abrading plate of the present invention, a polishing unit 137 having a top ring 135 disposed on one side of the table 133, a dressing unit 141 having a dressing tool 139 and placed on the opposite side of the table 133, and a workpiece handling device 143 placed lateral to the polishing unit 137. In the washing section 150, two transport robots 101 movable in the direction of an arrow G are disposed in the center region, and on one side of the robot line, primary and secondary washing devices 155, 157 and a spin dryer (or dryer with washing capability) 159 are disposed parallel to each other, and on the opposite side, two workpiece inverters 161, 163 are disposed parallel to each other. A cassette 165 containing unpolished wafers is disposed in the location shown in the figure, and the transport robot 101 on the right removes one wafer at a time and hands it over to the inverter 163, which inverts the wafer. The inverted wafer is passed from the right robot 101 to the left robot 101 and is transported to the workpiece handling device 143 of the polishing section 130.

The wafer on the handling device 143 is held on the bottom side of the top ring 135 of the polishing unit 137 moving along the dotted line, and is transferred above the turntable 133 to be polished on the polish surface 134 of the rotating turntable 133. The polished wafer is again returned to the handling device 143, is passed to the inverter 161 by the left robot 101, and is washed and inverted thereby. Then, the polished wafer is washed by the primary and secondary washing devices 155, 157 using water or chemical solution, is spun and dried in the spin dryer, and is returned to the original cassette 165 by the right robot 101. After the top ring 135 completes polishing, the wafer the dressing unit 141 moves over to the turntable 133 following the dotted line and presses the rotating dressing tool 139 to the polish surface of the rotating turntable 133 to perform conditioning of the polish surface 134. It should be mentioned that the structure of the turntable 133 can be any of the self-turning type, scroll type or cup type.

This polishing facility can be used inside a cleanroom. Because the polishing unit produces an abundant amount of contaminating substances, the entire polishing apparatus should be contained in a closed housing. The mist and dust particles produced from the polishing section and cleaning sections are exhausted by an exhausting device, and chemical filters are disposed in the ceiling for supplying clean air into the room. The pressure inside the facility is kept lower than the pressure in the surrounding region (cleanroom), so that contaminated air, mist and dust particles do not leak outside of the facility. Abrading plates are made of particles of high purity, and particle contamination is prevented by washing and drying the polished wafers before returning them to the wafer cassette, and therefore contamination by metallic contaminants and particles is avoided and the atmosphere in the cleanroom is not contaminated.

Industrial Applicability

The present invention provides an abrading plate having the self-stopping capability by optimizing the proportion of abrasive particles, binder and porosity in the abrading plate. A polishing apparatus using the abrading plate exhibits rapid leveling of the surface, but after the surface has been leveled, further material removal does not occur. Therefore, the process can be controlled by adjusting the polishing duration, and the surface uniformity is improved. Adopting the first and second stage polishing method of the present invention enables quick elimination of the irregularities in the first stage polishing, and, in the second stage polishing, surface material removal can be achieved uniformly on the entire surface by polishing under a condition of a high concentration of freed particles. The combined polishing process produces a flat surface quickly while controlling the thickness of the remaining films by removing the surface material uniformly from the leveled wafer. The polishing method is therefore applicable to precision polishing of semiconductor device patterned wafers.

What is claimed is:

1. An abrading plate for polishing an object to produce a flat and mirror surface thereon, said abrading plate comprising:
   abrasive particles having a particle size of less than two micrometers, a chemical purity of more than 90%, and a Na concentration of below 100 ppm;
   a binder material; and
   a porosity;
   wherein a ratio of said abrasive particles and said binder material is 1:x, where x is not less than 0.5 by volume, and said abrasive particles, said binder material and said porosity are in a proportion such that said abrasive particles are not less than 10% by volume, said binder material is not more than 60% by volume, and said porosity is 10–40% by volume.

2. An abrading plate according to claim 1, wherein said proportion is such that said abrasive particles are 10–60% by volume, said binder material is 30–60% by volume and said porosity is 10–40% by volume.

3. An abrading plate for polishing an object having a raised and depressed pattern thereon to produce a flat and mirror polished surface, said abrading plate comprising abrasive particles having a chemical purity of more than 90% and a Na concentration of below 100 ppm; wherein said abrading plate comprises said abrasive particles, a binder material, and a porosity.

4. A method for polishing an object having a raised and depressed pattern thereon to produce a flat and mirror polished surface, wherein said method is comprised by using an abrading plate, which comprises abrasive particles having a chemical purity of more than 90% and a Na concentration of below 100 ppm, a binder material, and a porosity.

5. A method according to claim 4, wherein a second stage polishing is further carried out by using a polishing cloth after said first stage polishing using said abrading plate is finished.

6. A method according to claim 4, wherein a second stage polishing is further carried out by using a second abrading plate after said first stage polishing using said abrading plate is finished.

7. A method according to claim 4, wherein said polishing is carried out after dressing an abrading surface of said abrading plate so as to produce a micro-rough surface structure thereon.

8. A method according to claim 4, further comprising:
   dressing an abrading surface of said abrading plate so as to produce a finely roughened surface structure thereon;
   removing released particles adhering to said surface; and
   polishing said object.

9. A method according to claim 4, wherein said polishing is carried out while concurrently dressing an abrading surface of said abrading plate so as to produce a finely roughened surface structure thereon.

10. A method according to claim 4, wherein said polishing is carried out while supplying a liquid not containing abrasive particles so as to generate free abrasive particles released from said abrading surface of said abrading plate.

11. A method according to claim 10, wherein said liquid not containing abrasive particles is water or a chemical solution.

12. A method according to claim 4, wherein said polishing is carried out by using said abrading plate comprised of abrasive particles having not more than 0.5 $\mu$m particle size, a binder and a porosity.

13. A method according to claim 4, wherein said abrading plate comprises abrasive particles having a particle size of less than two micrometers and a chemical purity of more than 90%; a binder material; and a porosity; wherein a ratio of said abrasive particles and said binder material is 1:x, where x is not less than 0.5 by volume, and said abrasive particles, said binder material and said porosity are in a proportion such that said abrasive particles are not less than 10% by volume, said binder material is not more than 60% by volume, and said porosity is 10~40% by volume.

14. A method for polishing a semiconductor wafer having a raised and depressed pattern thereon to produce a flat and mirror polished surface, said method comprising:

polishing said semiconductor wafer by using an abrading plate having abrasive particles, binder material and porosity, a proportion of said abrasive particles, binder material and porosity being such that said abrasive particles are 10%–60% by volume, said binder material is 30–60% by volume, and said porosity is 10~40% by volume, wherein said abrading plate has a self-stopping function which stops or reduces a removal rate of continued polishing after said raised pattern is flattened and the surface has become level.

15. A method for polishing a semiconductor wafer having a raised and depressed pattern thereon to produce a flat and mirror polished surface, said method comprising:

polishing said semiconductor wafer by using an abrading plate having abrasive particles, binder material and porosity, a proportion of said abrasive particles, binder material and porosity being such that said abrasive particles are 10–60% by volume, said binder material is 30–60% by volume, and said porosity is 10~40% by volume;

wherein said abrasive particles have a Na concentration of below 100 ppm.

16. A polishing apparatus having an abrading plate for polishing an object to produce a flat and mirror surface thereon, said abrading plate comprising:

abrasive particles having a particle size of less than two micrometers, a chemical purity of more than 90%, and a Na concentration of below 100 ppm;

a binder material; and a porosity;

wherein a ratio of said abrasive particles and said binder materials is 1:x, where x is not less than 0.5 by volume, and a proportion of said abrasive particles, said binder material and said porosity is such that said abrasive particles are not less than 10% by volume, said binder material is not more than 60% by volume, and said porosity 10~40% by volume.

17. A polishing apparatus having an abrading plate for polishing an object having raised and depressed patterns thereon to produce a flat and mirror polished surface, said abrading plate comprising abrasive particles having a chemical purity of more than 90% and a Na concentration of below 100 ppm; wherein said abrading plate comprises said abrasive particles, binder material, and a porosity.

18. A polishing apparatus according to claim 17, wherein said polishing apparatus further comprises a dresser for dressing an abrading surface of said abrading plate so as to produce a finely roughened surface structure thereon.

19. A polishing apparatus according to claim 18, wherein said dresser comprises a diamond dresser.

20. A polishing apparatus according to claim 18, wherein said dresser comprises a brush.

21. A polishing apparatus according to claim 18, wherein said dresser comprises a water jet.

22. An abrading plate for polishing an object having a raised and depressed pattern thereon, said abrading plate comprising:

abrasive particles;

a binder; and a porosity;

wherein a proportion by volume of said abrasive particles, binder, and porosity is such that said abrasive particles are 10–60% by volume, said binder material is 30–60% by volume, and said porosity is 10~40% by volume and said abrading plate having a self-stopping function which stops or reduces a removal rate of continued polishing after said raised patterns are flattened and the surface has become level.

* * * * *